(12) United States Patent
Lin et al.

(10) Patent No.: US 12,051,911 B2
(45) Date of Patent: Jul. 30, 2024

(54) LOAD-INDEPENDENT CLASS E POWER AMPLIFIER FOR COIL ARRAY SYSTEMS

(71) Applicants: University of Florida Research Foundation, Inc., Gainesville, FL (US); MEDIATEK SINGAPORE, LTD., Solaris (SG)

(72) Inventors: Jenshan Lin, Gainesville, FL (US); Ron-Chi Kuo, Gainesville, FL (US); Hasnain Akram, Burlington, MA (US)

(73) Assignees: UNIVERSITY OF FLORIDA RESEARCH FOUNDATION, INCORPORATED, Gainesville, FL (US); MEDIATEK SINGAPORE, LTD., Solaris (SG)

( * ) Notice: Subject to any disclaimer, the term of this patent is extended or adjusted under 35 U.S.C. 154(b) by 1429 days.

(21) Appl. No.: 16/338,432

(22) PCT Filed: Sep. 29, 2017

(86) PCT No.: PCT/US2017/054381
§ 371 (c)(1),
(2) Date: Mar. 29, 2019

(87) PCT Pub. No.: WO2018/064518
PCT Pub. Date: Apr. 5, 2018

(65) Prior Publication Data
US 2023/0198308 A1 Jun. 22, 2023

Related U.S. Application Data

(60) Provisional application No. 62/402,121, filed on Sep. 30, 2016.

(51) Int. Cl.
*H02J 7/00* (2006.01)
*H02J 50/12* (2016.01)
*H03H 7/38* (2006.01)

(52) U.S. Cl.
CPC ............... *H02J 50/12* (2016.02); *H03H 7/38* (2013.01)

(58) Field of Classification Search
USPC ........................................................ 320/108
See application file for complete search history.

(56) References Cited

U.S. PATENT DOCUMENTS 5,311,973 A 5/1994 Tseng et al.
8,933,594 B2 * 1/2015 Kurs ..................... B60L 53/665
320/108

(Continued)

FOREIGN PATENT DOCUMENTS

CN 204131156 U 1/2015
WO 2015099914 A1 7/2015

OTHER PUBLICATIONS

International Search Report mailed Nov. 27, 2017.

(Continued)

*Primary Examiner* — Samuel Berhanu
(74) *Attorney, Agent, or Firm* — Thomas | Horstmeyer, LLP

(57) ABSTRACT

Various examples are provided for power amplifiers for coil array systems, which include load-independent Class E power amplifiers. In one example, a wireless charging system includes a three-dimensional (3D) coil array; and control circuitry configured to adjust a magnetic field generated by the 3D coil array, the control circuitry comprising a switching structure coupled to transmitting (TX) coils of the 3D coil array via independent matching networks. The independent matching networks can be LCL-matching networks.

11 Claims, 16 Drawing Sheets

(56) References Cited

U.S. PATENT DOCUMENTS

| | | | |
|---|---|---|---|
| 9,143,000 | B2 | 9/2015 | Leabman et al. |
| 2011/0018498 | A1* | 1/2011 | Soar ........................ B60N 2/90 320/108 |
| 2011/0163714 | A1* | 7/2011 | Ettes ..................... H02J 50/402 320/108 |
| 2011/0278945 | A1 | 11/2011 | Wheatley, III et al. |
| 2012/0153742 | A1 | 6/2012 | Lee et al. |
| 2013/0119926 | A1 | 5/2013 | Lin |
| 2014/0117926 | A1 | 5/2014 | Hwu et al. |
| 2014/0176055 | A1 | 6/2014 | van Lammeren et al. |
| 2014/0184155 | A1* | 7/2014 | Cha ......................... H02J 50/12 320/109 |
| 2014/0191710 | A1 | 7/2014 | Van Lammeren et al. |
| 2014/0266020 | A1 | 9/2014 | Van Lammeren et al. |
| 2015/0130406 | A1 | 5/2015 | Jing |
| 2015/0222129 | A1* | 8/2015 | McCauley .............. H01F 27/36 307/104 |
| 2015/0326061 | A1* | 11/2015 | Davison ................ H02J 7/0044 320/108 |
| 2015/0326063 | A1 | 11/2015 | Leabman et al. |
| 2015/0364938 | A1 | 12/2015 | Lapetina et al. |
| 2016/0036245 | A1* | 2/2016 | Chang ..................... H02J 50/10 307/104 |
| 2017/0187197 | A1* | 6/2017 | Tan .......................... H02J 5/00 |
| 2018/0375488 | A1* | 12/2018 | Sira ...................... H04B 1/0458 |
| 2019/0052124 | A1 | 2/2019 | Riiehl et al. |
| 2019/0165600 | A1* | 5/2019 | Cho ....................... H02J 7/0042 |

OTHER PUBLICATIONS

X. Lu, P. Wang, D. Niyato, D. I. Kim, and Z. Han, "Wireless charging technologies: fundamentals, standards, and network applications," IEEE Commun. Surveys & Tutorials, vol. 18, No. 2, 2016, pp. 1413-1452.

S. Aldhaher, P. D. Mitcheson, and D. C. Yates, "Load-independent class EF inverters for inductive wireless power transfer," in Proc. IEEE Wireless Power Transfer Conf., pp. 1-4, May 2016.

X. Mou, O. Groling, H. Sun, "Energy efficient and adaptive design for wireless power transfer in electric vehicles," IEEE Trans. Ind. Electron., vol. pp, No. 99, Mar. 2017, pp. 1-10.

N.O. Sokal, "Class-E RF power amplifiers," in QEX, pp. 9-20, 2001.

Y. Li and S.-M. Sue, "Exactly analysis of ZVS behavior for class-E inverter with resonant components varying," in proc. IEEE Conf. Industrial Electronics Applications, pp. 1239-1244, Jun. 2011.

M. Fu, T. Zhang, X. Zhu, P. C.-K. Luk, and C, Ma, "Compensation of cross coupling in multiple-receiver wireless power transfer systems," IEEE Trans. Ind. Inform., vol. 12, No. 2, Apr. 2016, pp. 474-482. (Final Manuscript Jan. 2016) p. 1-9.

M. Treffers, "History, current status and future of the wireless power consortium and the Qi interface specification," IEEE Circuits Syst. Mag., vol. 15, 2015, pp. 28-31.

Y.-S. Hwang, S.-C. Wang, F.-C. Yang, and J.-J. Chen, "New compact CMOS Li-Ion battery charger using charge-pump technique for portable applications," IEEE Trans. Circuits Syst. I, Reg. Papers, vol. 54, No. 4, Apr. 2007, pp. 705-712.

M. L. G. Kissin, C.-Y. Huang, G. A. Covic, and J. T. Boys, "Detection of the tuned point of a fixed-frequency LCL resonant power supply," IEEE Trans. Power Electron., vol. 24, No. 4, Apr. 2009, pp. 1140-1143.

D. Ahn and S. Hong, "Wireless power transmission with self-regulated output voltage for biomedical implant," IEEE Trans. Ind. Electron., vol. 61, No. 5, May 2014, pp. 2225-2235.

Lin et al., "Mathematic analysis of omnidirectional wireless power transfer—part-II three-dimensional systems," IEEE Trans. Power Electron., vol. 32, No. 1, Jan. 2017, pp. 613-624.

Z. N. Low, R. A. Chinga, R. Tseng, and J. Lin, "Design and test of a high-power high-efficiency loosely coupled planar wireless power transfer system," IEEE Trans. Ind. Electron., vol. 56, No. 5, pp. 1801-1812, May 2009.

W. Chen, R. A. Chinga, S. Yoshida, J. Lin, C. Chen, and W. Lo, "A 25.6 W 13.56 MHz wireless power transfer system with a 94% efficiency GaN class-E power amplifier," in IEEE MTT-S Int. Microw. Symp. Dig., Jun. 2012.

S.-A. E. Hamamsy, "Design of high-efficiency RF class-D power amplifier," IEEE Trans. Power Electron., vol. 9, No. 3, May 1994, pp. 297-308.

R.-C. Kuo, P. Riehl, and J. Lin, "3-D Wireless charging system with flexible receiver coil alignment," in Proc. IEEE Wireless Power Transfer Conf., May 2016, pp. 1-4.

Y.-L. Lyu, F.-Y. Meng, G.-H. Yang, B.-J. Che, Q. Wu, L. Sun, D. Erni, and J. Li, "A method of using nonidentical resonant coils for frequency splitting elimination in wireless power transfer," IEEE Trans. Power Electron., vol. 30, No. 11, Nov. 2015, pp. 6097-6106.

K. Lee and D.H. Cho, "Diversity analysis of multiple transmitters in wireless power transfer system", IEEE Microw. Compon. Lett., vol. 49, No. 6, Jun. 2013, pp. 2946-2952.

F. Mastri, A. Costanzo, and M. Mongiardo "Coupling-independent wireless power transfer," IEEE Microw. Compon. Lett., vol. 26, No. 3, Mar. 2016, pp. 222-224.

D. H. Tran, V. B. Vu, and W. Choi, "Design of a high efficiency wireless power transfer system with intermidiate coils for the on-board chargers of electric vehicles," IEEE Trans. Power Electron., vol. 33, No. 1, 2018, pp. 175-187.

X. Li, X. Dai, Y. Li, Y. Sun, Z. Ye, and Z. Wang "Coupling coefficient identification for maximum power transfer in wpt system via impedance matching," IEEE PELS Workshop Emerging Technol.: Wireless Power Transfer (WoW), pp. 27-30, Mar. 2016.

Y. Lim, H. Tang, S. Lim, and J. Park "An adaptive impedance-matching network based on a novel capacitor matrix for wireless power transfer," IEEE Trans. Power Electron., vol. 29, pp, No. 8, Aug. 2014, pp. 4403-4413.

A4WP Wireless Power Transfer System Baseline System Specification, V. 1.3, Nov. 2014.

P. Cong, M. Suster, N. Chaimanonart, and D. Young, "Wireless power recharging for implantable bladder pressure sensor," in Proc. IEEE Sensors, pp. 1670-1673, Oct. 2009.

R. Tseng et al, "Introduction to the Alliance for Wireless Power loosely-coupled wireless power transfer system specification version 1.0," in Proc. IEEE WPTC, May 2013.

M. Kiani et al, "Design and optimization of a 3-coil inductive link for efficient wireless power transmission," IEEE Trans. Biomed. Circuits Syst., vol. 5, No. 6, pp. 579-591, Dec. 2011.

J. Jadidian and D. Katabi, "Magnetic MIMO: How to charge your phone in your pocket," in Proc. Int. Conf. Mobile Computing Networking, pp. 495-506, Sep. 2014.

P. Riehl, et al, "Wireless power systems for mobile devices supporting inductive and resonant operating modes," IEEE Trans. Microwave Theory Techniques, vol. 63, No. 3, pp. 780-790, Mar. 2015.

J. Kim, D. Kim, K. Kim, and Y. Park, "Free-positioning wireless charging system for hearing aids using a bowl-shaped transmitting coil," in Proc. IEEE WPTC, pp. 60-63, May 2014.

E. Waffenschmidt and T. Staring, "Limitation of inductive power transfer for consumer applications," in Proc. IEEE European Conf. Power Electronics Applications, pp. 1-10, Sep. 2009.

H. Lang, A. Ludwig, and C. Sarris, "Magnetic near-field focusing and optimal wireless power transfer," in Proc. IEEE WPTC, May 2015.

J.Choi et al, "Design of high efficiency wireless charging pad based on magnetic resonance coupling," in Proc. 42nd European Microwave Conf., pp. 916-919, Nov. 2012.

R. Kuo, P. Riehl, A. Satyamoorthy, B. Plumb, P.Tustin, and J. Lin, "A 3D resonant wireless charger for a wearable device and a mobile phone," in Proc. IEEE WPTC, May 2015.

B. Choi, E. Lee, Y. Sohn, G. Jang, and C. Rim, "Six degree of freedom mobile inductive power transfer by crossed dipole Tx and Rx coils," IEEE Trans. Power Electronics, vol. 31, No. 4, pp. 3252-3272, Nov. 2015.

\* cited by examiner

TABLE I
PARAMETERS OF EQUIVALENT CIRCUIT MODEL

| Parameter | Value | |
|---|---|---|
| | Wearable Device | Mobile Phone |
| $L_{TX}$* | 1.08 μH | |
| $R_{TX}$ | 0.17 Ω | |
| $C_S$ | 1.32 nF | |
| $L_{RX}$ | 5.85 μH | 1.28 μH |
| $R_{RX}$ | 3.69 Ω | 0.49 Ω |
| $C_{2a}$ | 94.2 pF | 445 pF |
| $C_{2b}$ | 100 pF | 300 pF |
| $R_L$ | 50 Ω | 50 Ω |

*TX coil is made by copper wire with 16 AWG thickness

TABLE II
COMPARISON OF LOAD-INDEPENDENT REALIZATIONS FOR WPT SYSTEM

|  |  | [4] | [5] | [6] | This work |
|---|---|---|---|---|---|
| PA Topology |  | voltage-source inverter | class-D | class-EF | class-E |
| Frequency |  | 38.4 kHz | 8 MHz | 6.78 MHz | 6.78 MHz |
| WPT application |  | N/A | Single TX, single RX | Single TX, single RX | Multi-TXs, multi-RXs |
| Load variation ($\Omega$) | [Re] | 0.5-2 | N/A | 0-5 | 0-20 |
|  | [Im] | N/A | N/A | N/A | -120-+180 |

LOAD-INDEPENDENT CLASS E POWER AMPLIFIER FOR COIL ARRAY SYSTEMS

CROSS REFERENCE TO RELATED APPLICATIONS

This application is the 35 U.S.C. § 371 national stage application of PCT Application No. PCT/US2017/054381, filed Sep. 29, 2017, which claims priority to, and the benefit of, U.S. provisional application entitled "Load-Independent Class E Power Amplifier for Coil Array Systems" having Ser. No. 62/402,121, filed Sep. 30, 2016, both of which are hereby incorporated by reference in their entireties.

BACKGROUND

The wireless charging industry is a developing market that has grown rapidly. The most prominent market is for charging of mobile devices. However, the coupling between the transmitter and receiver coils can affect the ability to achieve fast charging at high efficiency. Because of this, wireless charging products typically operate using close alignment of the transmitter to the receiver. As a result, wireless charger designs that are currently available utilize planar structures, which facilitate use with mobile devices, and do not have much freedom in alignment of the receiver and transmitter coils.

SUMMARY

Embodiments of the present disclosure are related to power amplifiers for coil array systems, which include load-independent Class E power amplifiers.

In one aspect, among others, a wireless charging system comprises a three-dimensional (3D) coil array; and control circuitry configured to adjust a magnetic field generated by the 3D coil array, the control circuitry comprising a switching structure coupled to transmitting (TX) coils of the 3D coil array via independent matching networks. In one or more aspects, the TX coils can comprise a plurality of coils distributed about a circumference of a charging structure. The plurality of coils can be evenly distributed about the circumference of the charging structure. In various aspects, the switching structure can comprise an N-way switch. The N-way switch can be a 2-way switch or a 3-way switch. The 3-way switch can switch between V+, V− and ground. Reactance of the matching inductor ($X_{LM}$) and the matching capacitor ($X_{CM}$) can be related by:

$$X_{LM} = X_{CM} = \omega L_{TX} - \frac{1}{\omega C_s},$$

where $\omega$ is an operation frequency of the switching structure, $L_{TX}$ is a TX inductance of the corresponding TX coil. The capacitance $C_s$ can be provided by a pair of capacitors in series with the corresponding TX coil.

In one or more aspects, each of the independent matching networks can comprise a matching inductance ($L_M$) in series with a corresponding TX coil of the 3D coil array, and a matching capacitance ($C_M$) in parallel with the corresponding TX coil. The matching inductance ($L_M$) can be provided by a pair of inductors. Each of the independent matching networks can comprise a capacitance $C_s$ in series with the corresponding TX coil. Each of the independent matching networks can comprise an adjustment capacitance coupled between a switch of the switching structure and the matching inductance ($L_M$). In various aspects, power for charging a receiving device can be provided by a differential amplifier coupled to the switching structure. The independent matching networks can be LCL-π matching networks.

Other systems, methods, features, and advantages of the present disclosure will be or become apparent to one with skill in the art upon examination of the following drawings and detailed description. It is intended that all such additional systems, methods, features, and advantages be included within this description, be within the scope of the present disclosure, and be protected by the accompanying claims. In addition, all optional and preferred features and modifications of the described embodiments are usable in all aspects of the disclosure taught herein. Furthermore, the individual features of the dependent claims, as well as all optional and preferred features and modifications of the described embodiments are combinable and interchangeable with one another.

BRIEF DESCRIPTION OF THE DRAWINGS

Many aspects of the present disclosure can be better understood with reference to the following drawings. The components in the drawings are not necessarily to scale, emphasis instead being placed upon clearly illustrating the principles of the present disclosure. Moreover, in the drawings, like reference numerals designate corresponding parts throughout the several views.

FIGS. 9A-9D and 10 illustrate simulation results for the control circuit of FIGS. 8A and 8B, in accordance with various embodiments of the present disclosure.

DETAILED DESCRIPTION

Figure 1A:
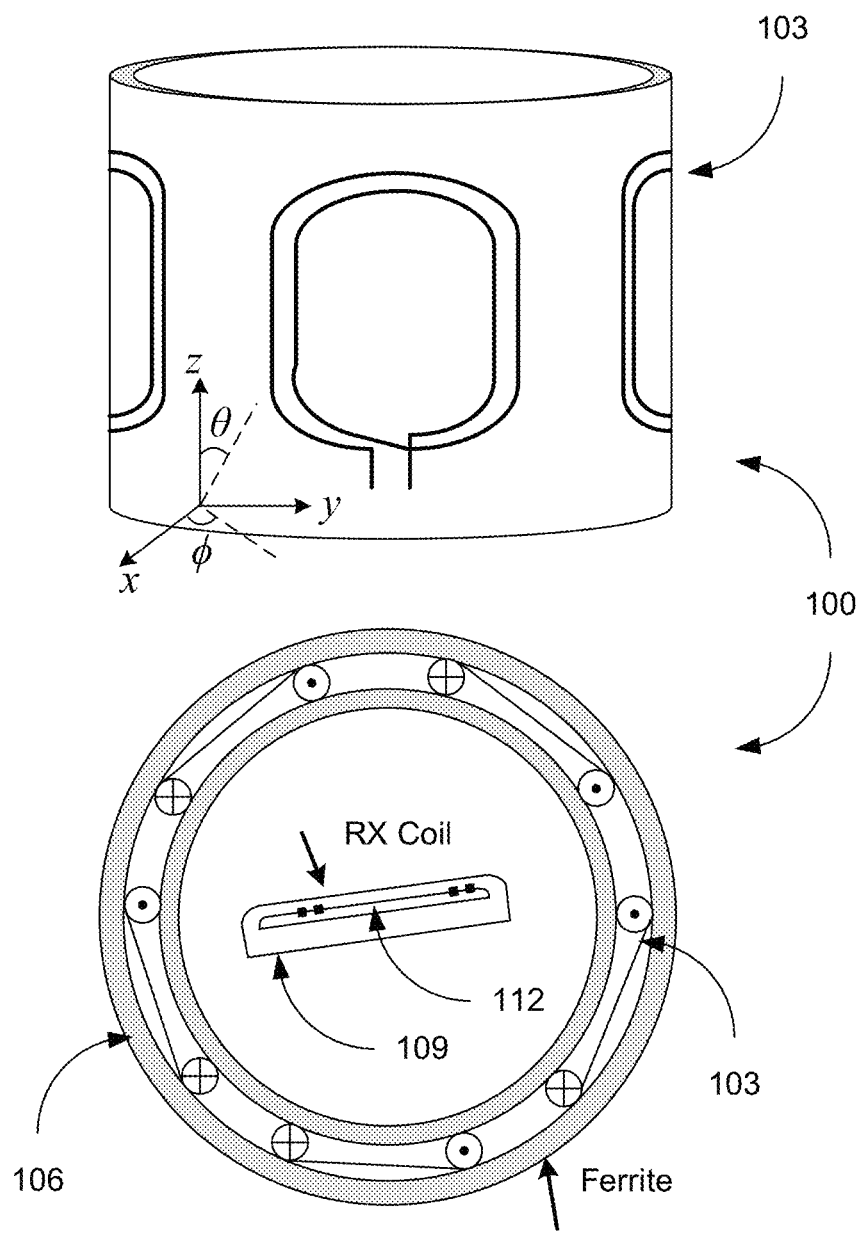
FIGS. 1A and 1B illustrate an example of a wireless charging structure including multiple transmitting (TX) coils, in accordance with various embodiments of the present disclosure.

Disclosed herein are various embodiments related to power amplifiers for coil array systems, which include load-independent Class E power amplifiers. Reference will now be made in detail to the description of the embodiments as illustrated in the drawings, wherein like reference numbers indicate like parts throughout the several views.

Small battery-powered electronics, such as wearable devices, the "Internet of Things" (IoT), and implantable medical devices, are getting popular in recent years. Placing connectors on such small devices to charge imbedded batteries becomes challenging, while wireless charging makes an appealing alternative. The market of planar wireless chargers for mobile communication devices, watches and other wearable gadgets is currently maturing. Therefore, there is an increasing need in a single wireless charger capable supporting multiple devices of different shapes and sizes, as well as at different power levels.

Among different wireless power transfer (WPT) methods, magnetic resonance is a preferred candidate when trade-offs between user experience and power transfer efficiency are being considered. The most general requirement to design a WPT transmitter is to maintain a stable system without sacrificing the ability of charging multiple devices simultaneously at useful charging rate for each device. This concept also reflects the characteristic of the battery charging profile that is typically begins with a constant current mode and then, when the cell charge level reaches a certain value, changing to the constant voltage mode. A common solution is to implement a single passive matching network to generate either constant current or constant voltage flowing through the transmitting (TX) coil independently from a time-varying load. However, this limits the design possibilities of wireless transmitter to certain structures, such as a single TX coil or a TX coil array that activates only one coil at a time. While multiple load networks are used in, multiple power sources and power transistors are also needed.

Maximizing power transfer efficiency is always important for wireless power systems, which is an even more important design goal for the magnetic resonance system due to weaker coupling between the coils. Because of that, a switched power amplifier (PA) is more suitable than a linear amplifier to provide the required output power while minimizing power dissipation. Among all types of switched power amplifier, class-D and class-E are most common architectures used in wireless charging systems. Comparing key features of these two topologies, class-E with better high-frequency power transfer efficiency, low number of power transistors and simpler gate drive circuitry becomes a more apposite choice.

A maximum efficiency of 94% has been achieved for a 13.56 MHz WPT system by optimizing the load network. However, a main challenge of this system is the high sensitivity to the output impedance, which means that the zero-voltage switching occurs only at certain load resonance values. When a transmitting system supports more than one receiving (RX) device, the load variation may easily lead to hard-switching, efficiency degrade, as well as the increase in power consumption and component overheat. Therefore, a solution to improve a WPT transmitter from load variation is presented here. The design concept is analyzed and demonstrated using a class-E power amplifier and a 3-D coil array system.

In order to support multiple devices simultaneously, wireless chargers need to maintain a constant transmitting coil current independent from time-varying loads. Because of this, wireless chargers typically utilize a matching network to generate a constant transmitting coil current flowing through the transmitting (TX) coil. This limits the design possibilities of wireless transmitter to certain structures, such as a single TX coil or a TX coil array that activates only one coil at a time. However, a single TX coil structure is not always optimal. For instance, it may be advantageous to design a coil array system for charging receiving devices with different size scale. Moreover, a coil array system allowing multiple TX coils to be activated simultaneously can improve the power transfer efficiency and the freedom of positioning. However, with existing tuning techniques, it is challenging to generate a constant TX coil current for multiple TX coils. This description presents a circuit that allows the coils to be selectively activated with different phase relationships. In addition, the circuit can provide a constant TX coil current regardless of the charging status or the orientation of receiving device, in order to enhance the system stability.

Wireless power transmitters that use arrays of coils are available. For example, the Nokia DT-900 wireless charger includes three coils that can be selectively activated. Nonetheless, these wireless charging products are designed to only drive a single TX coil at a time and to generate a constant TX coil current to a single receiving device. Although some wireless charging systems can maintain a constant TX coil current for multiple receiving devices simultaneously, the matching circuit is only suitable for a single transmitting coil structure.

Referring to FIG. 1A, shown is an example of a wireless charging structure 100 with multiple transmitting (TX) coils 103 aligned equally along a cylindrical wall 106. The number of the transmitting coils, n, is a tradeoff between the size of the cylinder charger, the number of the supported devices, and the type of receiving devices. The magnetic field generated by each TX coil 103 can be represented by a phase and amplitude, as a phasor expression. The cylindrical wall 106 can comprise a piece of flexible ferrite sheet to channel the magnetic flux back to the TX coils 103. To create a volume with arbitrary spatial freedom of placement, omni-directional magnetic flux vectors can be generated to enhance the amplitude of the magnetic field for sufficient coupling at the center (or other locations) of the wireless charging structure 100.

Consider a receiving (RX) device 109 such as, e.g., a smart phone, tablet or other portable device. A user can arbitrarily place the RX device 109 inside the wireless charging structure 100, which can optimize the power delivery through amplitude and phase control of the transmitter coil array. The coils 103 can be selectively activated with different phase and/or amplitude relationships to achieve improved and/or optimized power delivery through the RX coil 112 of the RX device 109. The coil control circuitry can provide constant TX coil current regardless of the charging status and/or orientation of the receiving (RX) device. When used in a vehicle, this can greatly enhance the safe operation of the vehicle by not distracting the driver's attention.

Figure 1B:
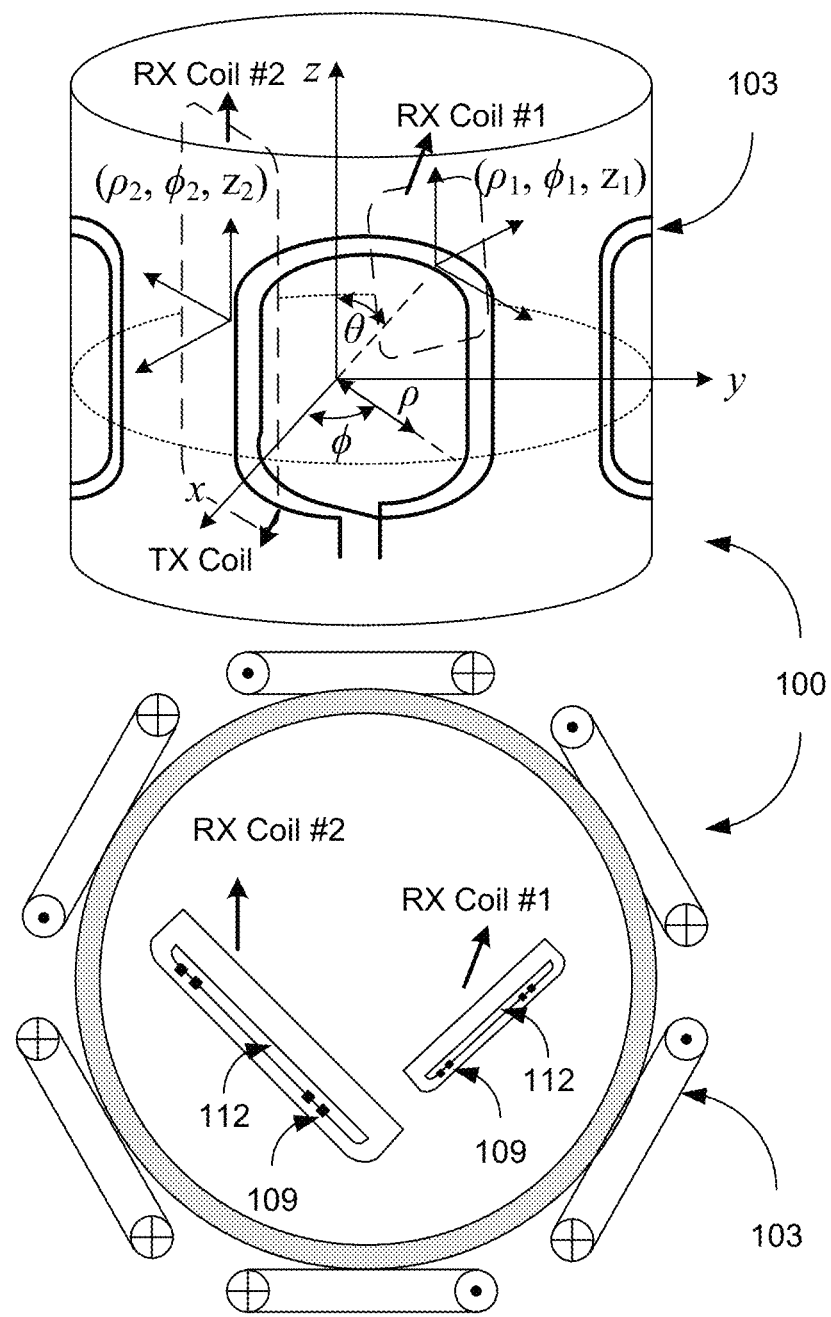

Although some wireless charging systems may be able to keep a constant TX coil current for multiple RX devices, their matching circuit is only suitable for a single TX coil structure. Wireless charging structures 100 that include multiple TX coils 103 utilize further controls to match with the different TX coils 103. FIG. 1B shows the wireless charging structure 100 with multiple RX devices 109 positioned within the multiple TX coils 103. The coils 103 can be selectively activated with different phase and/or amplitude relationships to achieve effective power delivery through the RX coils 112 positioned with different orientations within the multiple TX coils 103. Time-varying loads further complicate this situation, especially where each load exhibits different time-variations.

Circuit Design

Figure 2:
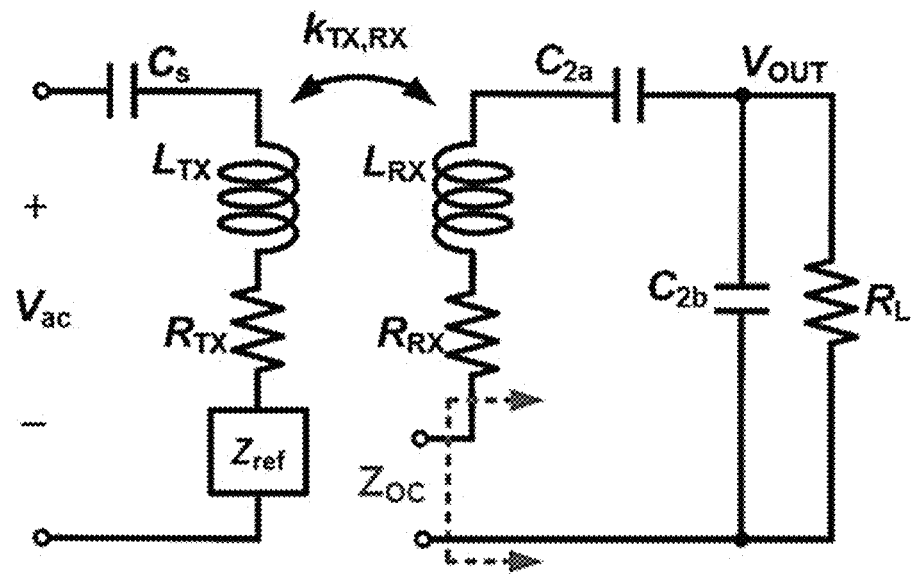
FIG. 2 is an equivalent circuit model for a typical single TX and single receiving (RX) wireless power transfer (WPT) system, in accordance with various embodiments of the present disclosure.

Equivalent circuit model and reflected impedance. To reduce design complexity, in the wireless charging structure 100, all TX coils 103 can be set to be identical. Component values of respective matching networks can also be kept the same. A system with single TX and RX coils having a single matching network is used as an example to explain the theory behind this. The equivalent circuit model for a typical system is shown in FIG. 2, where $C_s$ is the resonant capacitor placed in series with the TX coil, and $L_{TX}$ and $L_{RX}$ represent the self-inductance of the primary and secondary coils, respectively, and $R_{TX}$ and $R_{RX}$ represent the coil resistances. Generally, in a real charging system, a rectifier and a low-dropout (LDO) voltage regulator are connected to the receiver after $L_{RX}$ and $C_{2a}$ to convert AC power to the regulated DC output. Therefore, $C_{2b}$ and $R_L$ here are used as an equivalent impedance model of the following stages to simplify the calculation. Notably, reflected impedance, $Z_{ref}$, is an equivalent resistance appeared and induced by the receiver network, which can be expressed as:

$$Z_{ref} = \frac{(\omega_0 M_{TX,RX})^2}{Z_{OC}}, \quad (1)$$

where $\omega_0$ is the resonant frequency, which is also equivalent to the operating frequency in the magnetic resonance WPT system, $M_{TX,RX}$ is the mutual inductance between primary and secondary coils, and $Z_{OC}$ is the equivalent impedance at the receiver side when the circuit is open.

From FIG. 2, $Z_{OC}$ can be derived and written as $$Z_{OC} = j\omega_0 L_{RX} + \frac{1}{j\omega_0 C_{2a}} + R_{RX} + \frac{R_L}{j\omega_0 R_L C_{2b} + 1}, \quad (2)$$

where $R_{RX}$ is the series resistance of the receiving coil, $R_L$ is the varying load, whose value depends on the receiving device and the charging status of the battery; $C_{2a}$ and $C_{2b}$ are the adjusting capacitors that cancel the reactance of the receiving coil $L_{RX}$, so that the maximum power can be delivered. The value of $C_{2b}$ needs to be carefully selected to avoid the voltage dividing effect due to non-ideal matching scenario of $L_{RX}$ and $C_{2a}$ in a real system. Replacing Eq. (2) and the definition of mutual inductance $$\left(M_{TX,RX} = k_{TX,RX}\sqrt{L_{TX}L_{RX}}\right)$$

into Eq. (1) yields:

$$Z_{ref} = \frac{\omega_0^2 k_{TX,RX}^2 L_{TX} L_{RX}}{j\omega_0 L_{RX} + \frac{1}{j\omega_0 C_{2a}} + R_{RX} + \frac{R_L}{j\omega_0 R_L C_{2b} + 1}}, \quad (3)$$

where $k_{TX,RX}$ is the coupling coefficient between two coils. Most literature sources consider the ideal scenario where the reactance of $L_{RX}$ is perfectly cancelled by the matching series capacitor $C_{2a}$. This eliminates the first two terms of the denominator ($j\omega_0 L_{RX}+1/j\omega_0 C_{2a}$) and assumes that $j\omega_0 R_L C_{2b} \ll 1$, simplifying $Z_{ref}$ into:

$$Z'_{ref} = \frac{\omega_0^2 k_{TX,RX}^2 L_{TX} L_{RX}}{R_{RX} + R_L}, \quad (4)$$

which is purely resistive. However, when the inductance value of the TX coil is smaller than the RX coil, remanence of the reactance due to a non-ideal mismatch can no longer be ignored. Given that $Z_{ref}$ is proportional to $k_{TX,RX}^2$, even small variations of the coupling coefficient can result in large reactive values of $Z_{ref}$, which is shown graphically in FIGS. 3A-3F.

Figure 3A:
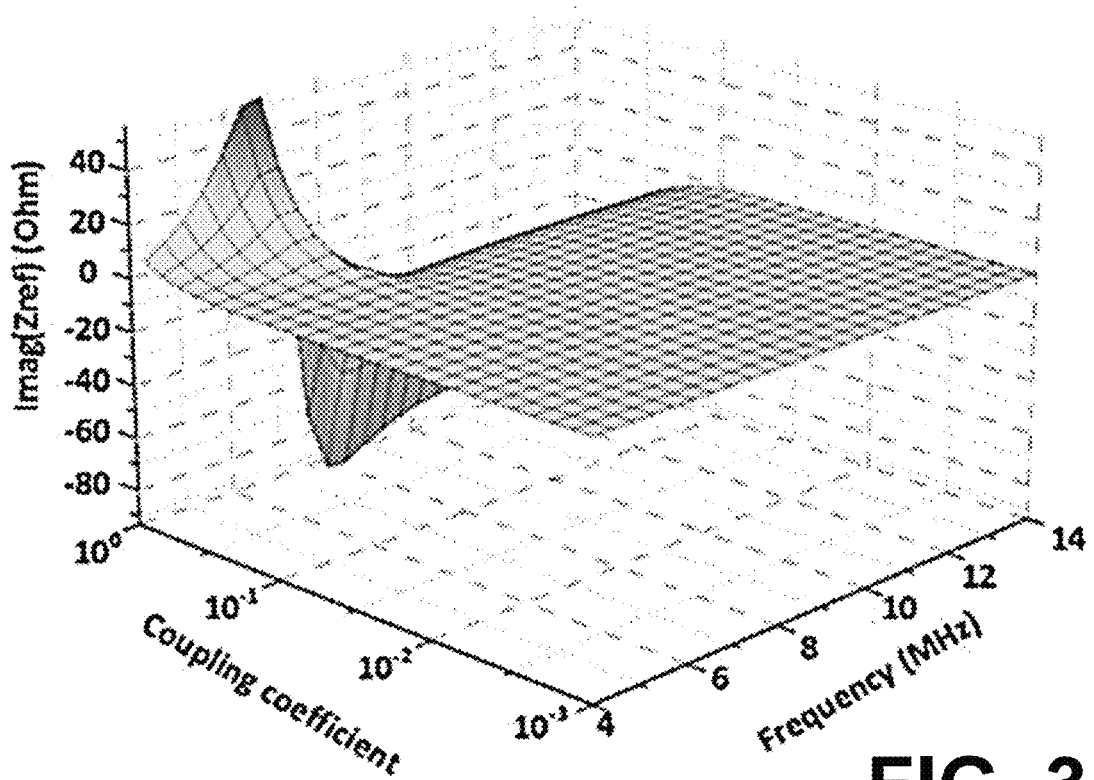
FIGS. 3A-3F illustrate examples of reflection impedance variation under different WPT charging scenarios, in accordance with various embodiments of the present disclosure.
Figure 3B:
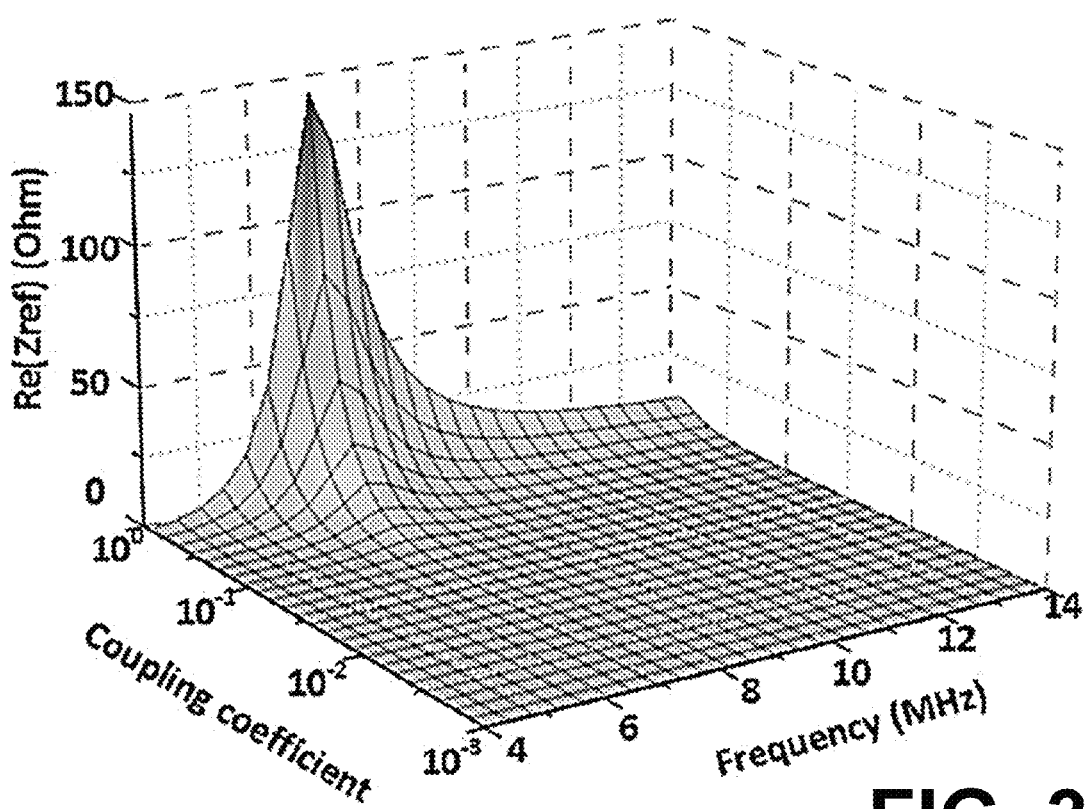
Figure 3C:
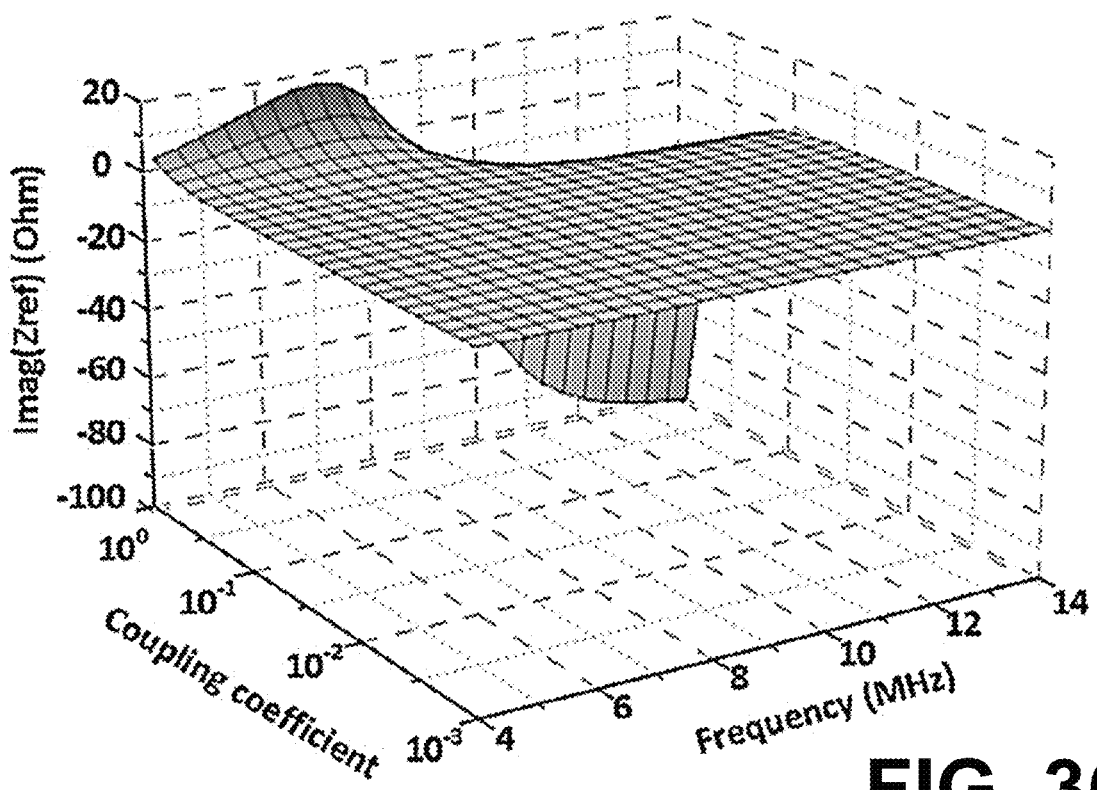
Figure 3D:
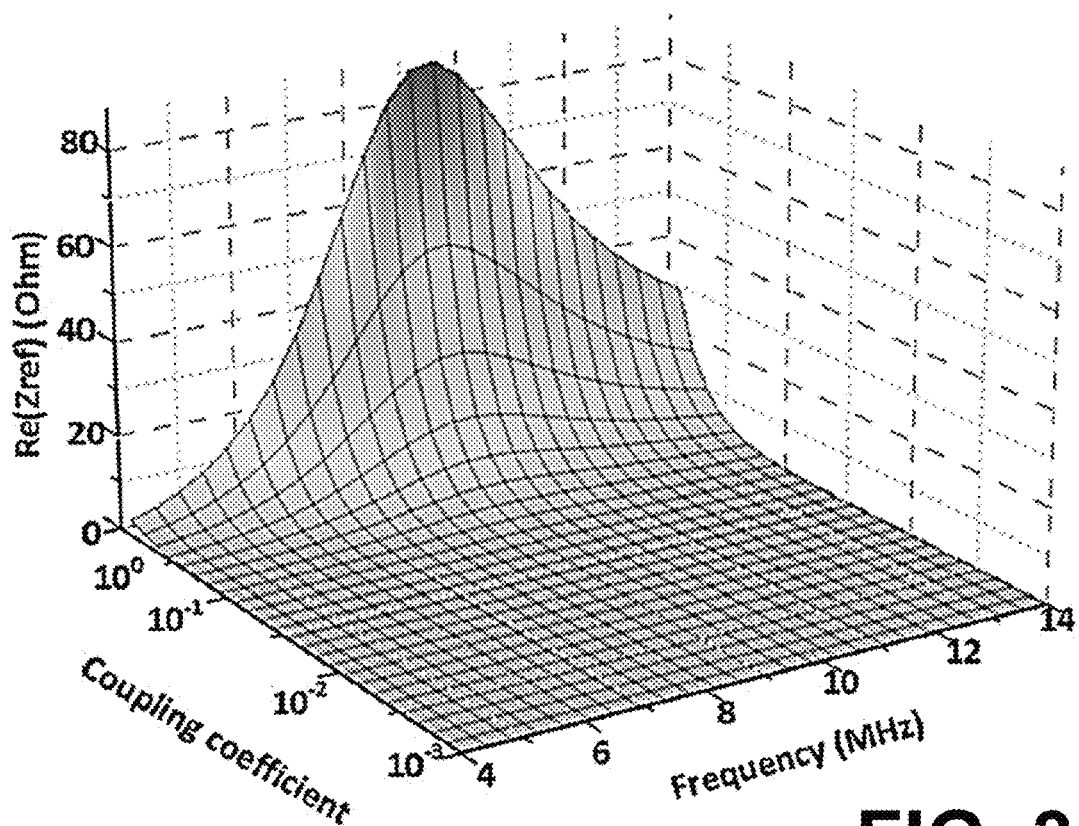
Figure 3E:
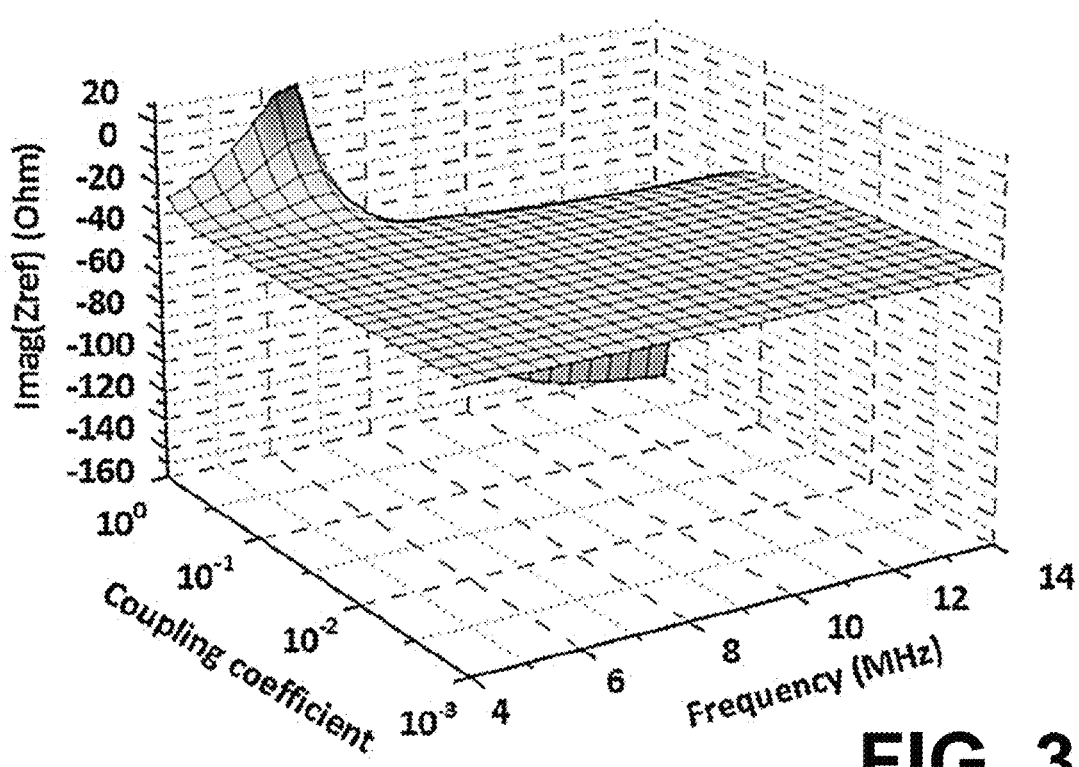
Figures 3F, 4:
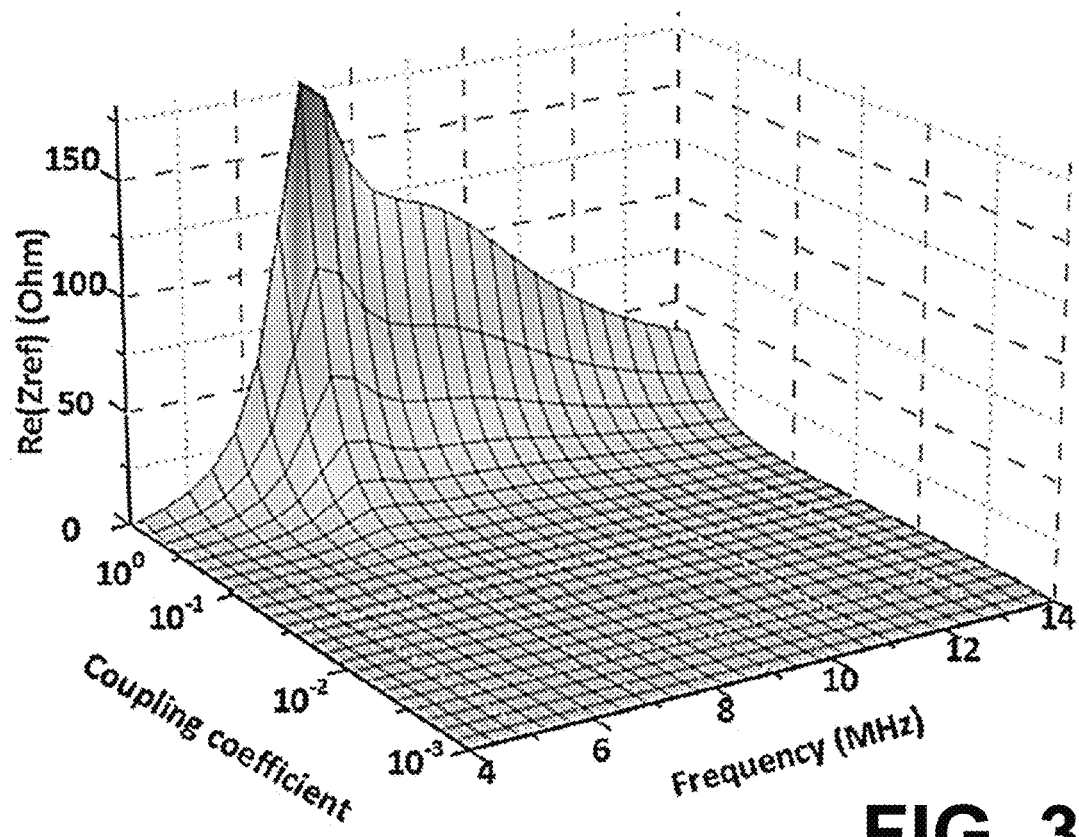
FIG. 4 is a table illustrating examples of equivalent circuit model parameters, in accordance with various embodiments of the present disclosure.

FIGS. 3A-3F illustrate how the reflection impedance ($Z_{ref}$) varies with the coupling coefficient and frequency for a wearable device and/or a mobile phone, where $k_{TX,RX}$ is plotted from worst case scenario ($k_{TX,RX}\approx 0$) to the best case scenario ($k_{TX,RX}=1$). FIGS. 3A and 3B illustrate when charging a wearable device, FIGS. 3C and 3D illustrate when charging a mobile phone, and FIGS. 3E and 3F illustrate charging a wearable device and a mobile phone simultaneously. FIGS. 3A, 3C and 3E show the reactance variation of $Z_{ref}$ under the three charging conditions. It can be observed that when $k_{TX,RX}$ is larger than $10^{-1}$, the reactance of $Z_{ref}$ becomes either inductive or capacitive in all three cases. When $k_{TX,RX}$ rises into the strong-coupled region, which usually occurs as the coupling becomes higher than 0.15, the change in $Z_{ref}$ becomes dramatic, especially when charging two devices at the same time, as shown in FIG. 3E. FIGS. 3B, 3D and 3F present the resistance fluctuation range of $Z_{ref}$ under the three charging conditions. It also can be noticed that $Z_{ref}$ tends to be capacitive more than inductive and the total range of the variation is from $-160\Omega$ to $20\Omega$ when a TX system is designed to charge a mobile phone and a wearable device. This also explains the impedance variation range defined by AirFuel specification (A4WP Wireless Power Transfer System Baseline System Specification, v. 1.3, November 2014), which is hereby incorporated by reference in its entirety. $Z_{ref}$ was calculated using parameters listed in the table in FIG. 4. A standard value of $50\Omega$ was used here to estimate the equivalent $R_L$. Considering other possible implementations, for instance, when $R_L$ is lower than $50\Omega$, the mismatch caused by $Z_{ref}$ becomes more significant.

Figure 5:
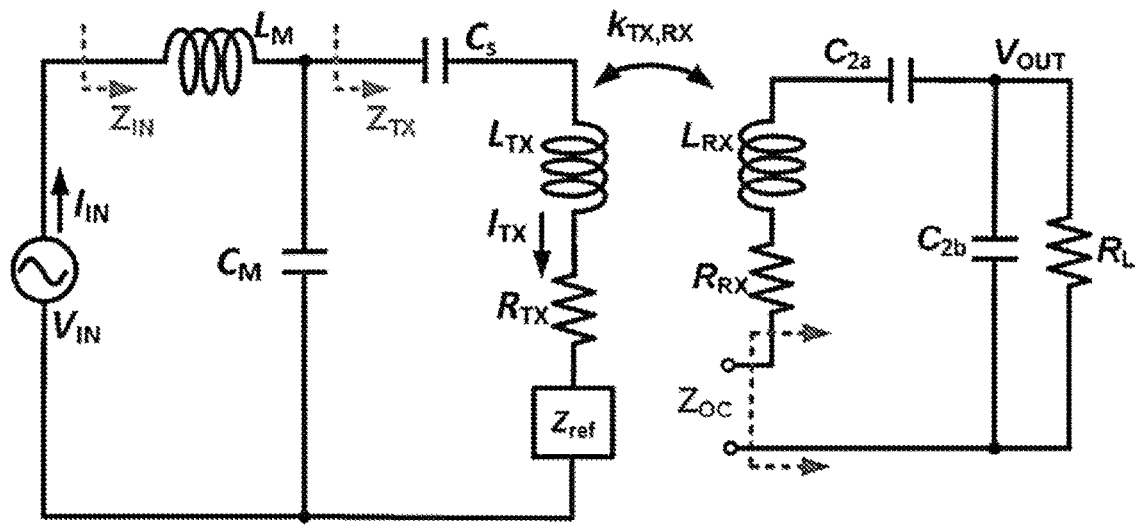
FIG. 5 is an equivalent circuit model of a LCL-π network for a single TX and single RX WPT system, in accordance with various embodiments of the present disclosure.

LCL-π matching network for a single TX coil. Matching networks can serve in a WPT system to fulfill several purposes including, e.g., to achieve maximum power transfer efficiency, to deliver nominal power to receiver, and/or to provide an active tuning mechanism to suppress frequency splitting. In a WPT system utilizing the wireless charging structure 100 of FIGS. 1A and 1B, to supply a fixed current to the load is beneficial, especially when charging multiple devices 109 simultaneously. For a general WPT system, the transmitting current $I_{TX}$ might vary with the reactance and/or resistance changes due to metal detuning, high permeability materials, the addition of receivers, and a time-increasing load, etc. Among the above reasons, addition of receivers causes the largest impedance variation. As mentioned earlier, once $I_{TX}$ starts changing, the power delivery to the receiver changes as well and the system stability becomes compromised. Therefore, a matching network, as shown in FIG. 5, can be used to generate a reasonably invariant coil current over a wide range of component and load variations. In the example of FIG. 5, $L_M$ is a matching inductor connected close to the power amplifier; and $C_M$ is a matching capacitor connected in parallel to the transmitter resonant network presented in FIG. 2.

Input current $I_{IN}$ can initially be defined as:

$$I_{IN} = \frac{V_{IN}}{Z_{IN}}. \tag{5}$$

Then, the coil impedance $Z_{TX}$ can be derived as:

$$Z_{TX} = j\omega_0 L_{TX} + \frac{1}{j\omega_0 C_S} + Z_{ref}. \tag{6}$$

Therefore, input impedance $Z_{IN}$ can be calculated as:

$$Z_{IN} = jXL_M + \frac{(-jXC_M)*Z_{TX}}{Z_{TX} - jXC_M}, \tag{7}$$

where $XL_M$ and $XC_M$ are the reactance of $L_M$ and $C_M$, respectively.

The current flowing through the TX coil can be divided as:

$$I_{TX} = I_{IN} \times \frac{(-jXC_M)}{Z_{TX} - jXC_M}. \tag{8}$$

To consider both resistive and reactive variation, $Z_{ref}$ is further unfolded into two terms, $\text{Im}\{Z_{ref}\}$ and $\text{Re}\{Z_{ref}\}$, which are the reactance and resistance of $Z_{ref}$, respectively. For compensating the reactive variation, the assumption is made as follows:

$$XL_M = XC_M = \omega_0 L_{TX} - \frac{1}{\omega_0 C_S} + \text{Im}\{Z_{ref}\} = X', \tag{9}$$

where $C_S$ is not only used to reach conjugate match with $L_{TX}$, but also to adjust the inductive or capacitive value caused by $Z_{ref}$ mismatch. Then, the TX impedance can be simplified as:

$$Z_{IN} = jX' + \frac{(-jX')*(jX' + \text{Re}\{Z_{ref}\})}{jX' + \text{Re}\{Z_{ref}\} - jX'} = \frac{X'^2}{\text{Re}\{Z_{ref}\}}. \tag{10}$$

From Eq. (5) and Eq. (10), the input current can be rewritten as:

$$I_{IN} = \frac{V_{IN} \times \text{Re}\{Z_{ref}\}}{X'^2}. \tag{11}$$

By insert Eq. (6) and Eq. (11) into Eq. (8), current flowing into the TX coil can be expressed as:

$$I_{TX} = I_{IN} \times \frac{-jX'}{jX' + \text{Re}\{Z_{ref}\} - jX'} = \frac{V_{IN}*\text{Re}\{Z_{ref}\}}{X'^2} \times \frac{-jX'}{\text{Re}\{Z_{ref}\}} = \frac{-jV_{IN}}{X'}. \tag{12}$$

From Eq. (12), it can be observed that TX coil does not depend on the resistance of $Z_{ref}$. Even though $I_{TX}$ is still proportional to 1/X', which is varied with $\text{Im}\{Z_{ref}\}$, it can be kept reasonably stable by carefully select the component $C_S$ value.

LCL-π matching network for multi-TX coils system. In the last section, a LCL-π matching network has been shown to be insensitive from $Z_{ref}$ variation for a single TX coil system. However, a single TX coil structure is not always optimal for a wireless charging system. For instance, it might be advantageous to design a coil array system for charging receiving devices of different shape and size. Moreover, a coil array system allowing multiple TX coils to be activated simultaneously can improve freedom of positioning and power transfer efficiency. Hence, to investigate the behavior of a multi-TX coils system, two different implementations with class-E power amplifier were simulated and compared.

Figure 6A:
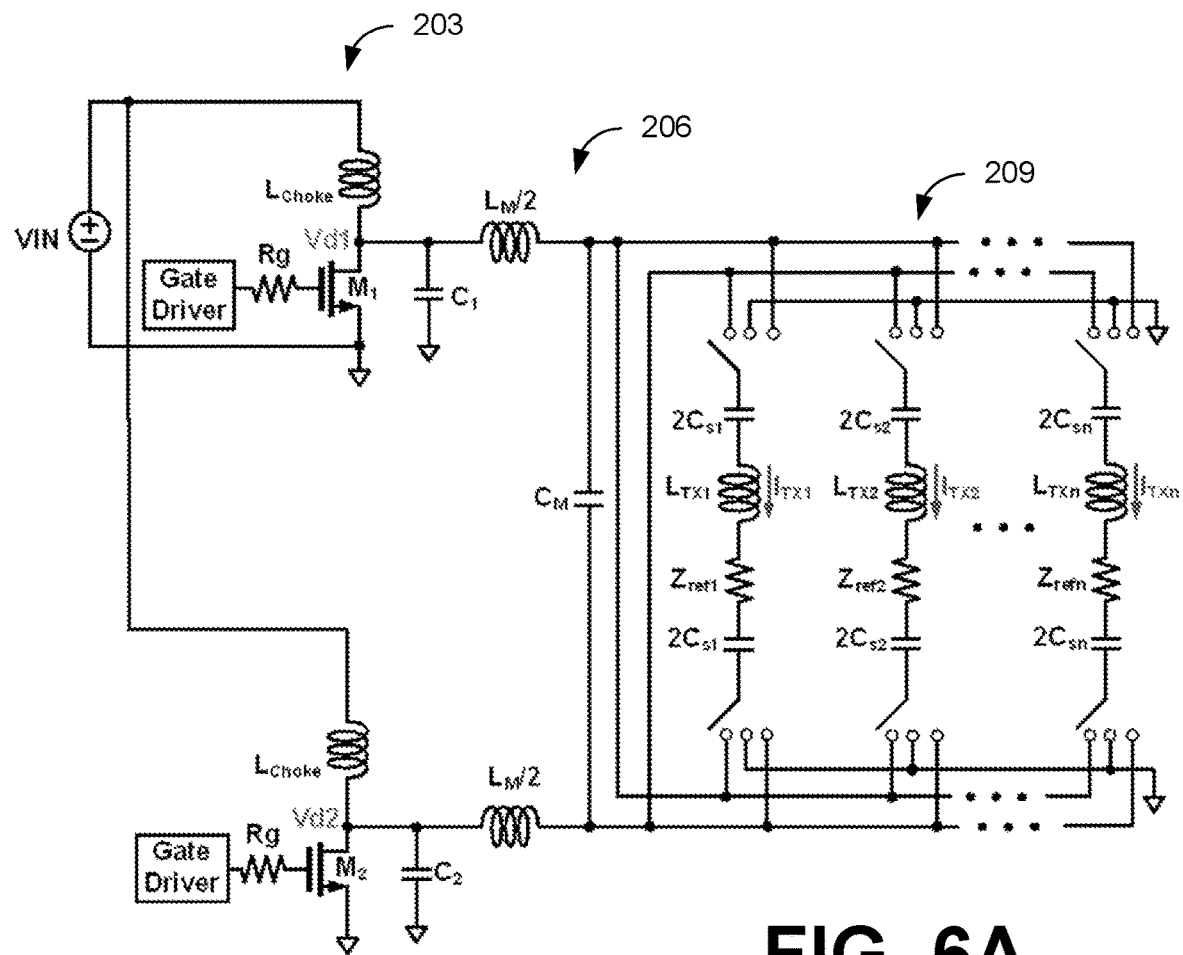
FIGS. 6A and 6B are schematic diagrams illustrating examples of a control circuit including a single LCL-π matching network coupled to a plurality of TX coils through a switching structure, in accordance with various embodiments of the present disclosure.

A single amplifier with a switching structure can be utilized to control such multi-TX coils and multi-RX coils charging systems. An example is shown in FIG. 6A, where the control circuit is realized with a differential amplifier 203 and a matching network 206 with a 3-way switching structure 209. In other embodiments, a single-ended amplifier can be used. In the example of FIG. 6A, the TX coils 103 are modeled by $L_{TXn}$, and the load of the RX device 109 is modeled by $Z_{refn}$. Even though the TX coil current $I_{TXn}$ can be adjusted by the matching network 206, $C_M$ and $L_M$, it is difficult to maintain $I_{TXn}$ constant with time-varying loads ($Z_{ref1} \neq Z_{ref2} \neq \ldots Z_{refn}$).

Figure 6B:
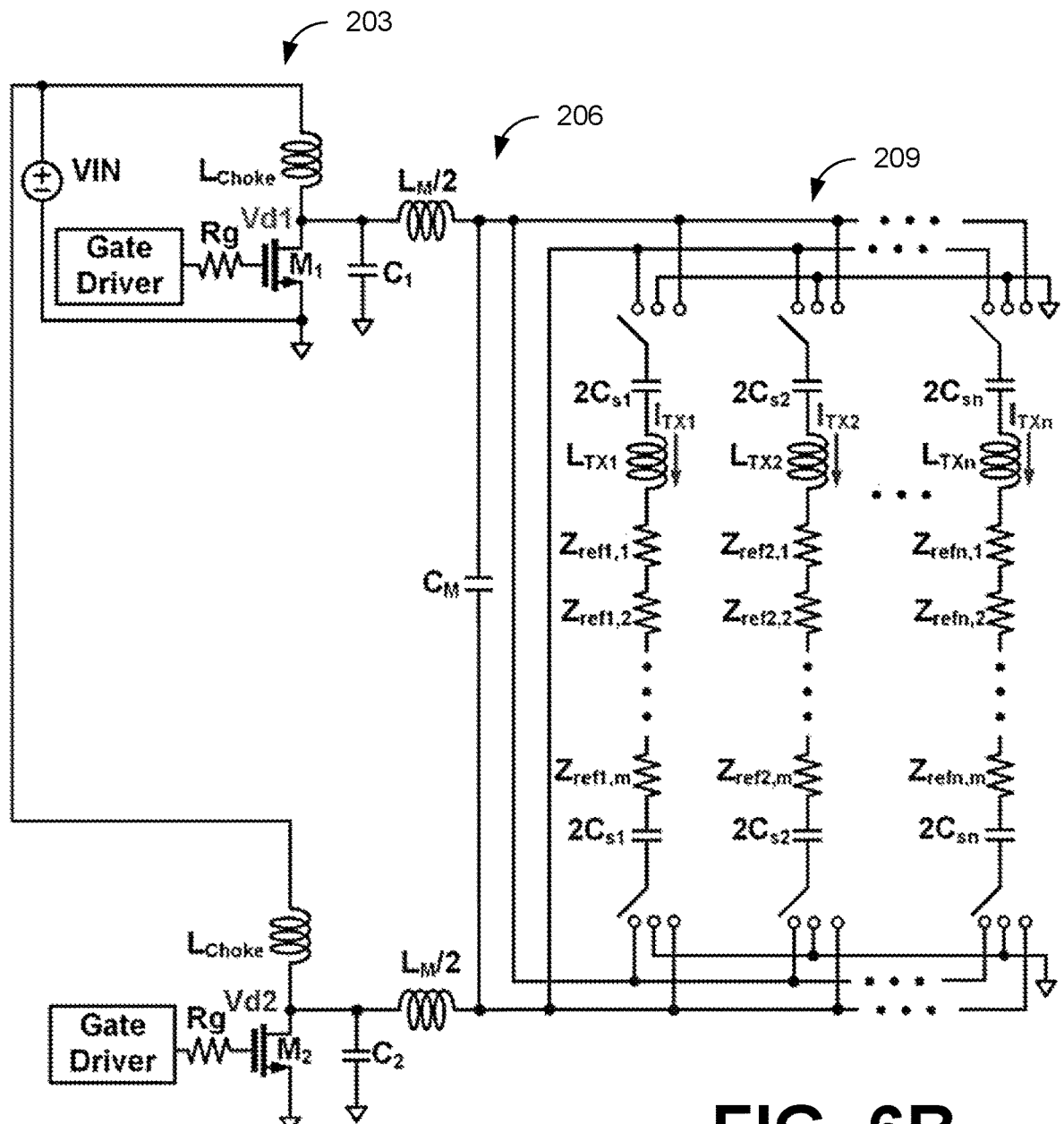

FIG. 6B illustrates the system with m RX devices 109, and their loads modeled by $Z_{refn,m}$. FIG. 6B shows the traditional connection of class-E power amplifier by sharing a single matching network. $Z_{ref1,1}, Z_{ref1,2}, \ldots,$ to $Z_{refn,m}$, represents the reflected impedance induced by receiving devices #1, #2, ..., to receiving device #n, respectively. The 3-way switch allows the TX coil to be activated selectively. Three terminals of the switch are connected to V+, V− and ground, respectively. Ideally, a turned on switch acts like a conductor without loss. However, in the real implementation, a small parasitic resistor, $r_{on}$, is introduced into the circuit. To reduce power loss and avoid heat generated by $r_{on}$, considering up to 25 W total power delivered by the coil, the power transistor for the switch should be carefully selected.

Figure 7:
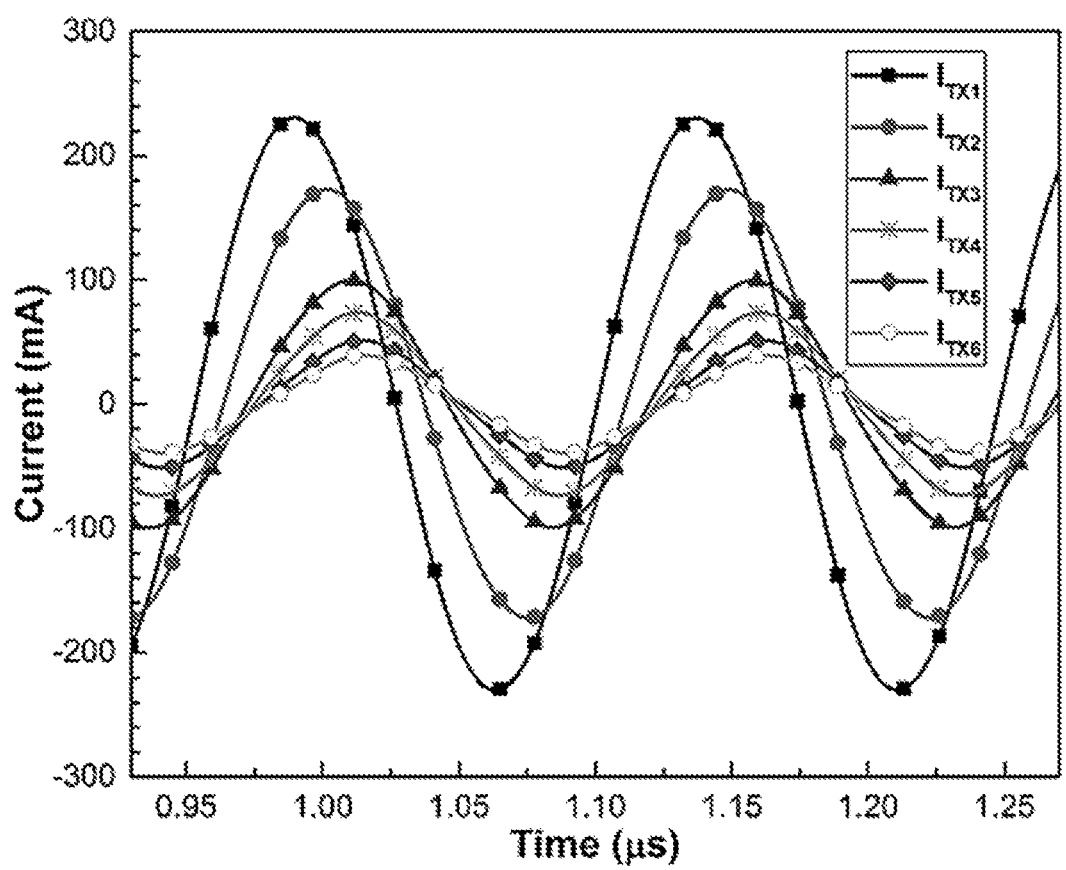
FIG. 7 illustrates simulation results for the control circuit of FIGS. 6A and 6B, in accordance with various embodiments of the present disclosure.

The control circuit of FIGS. 6A and 6B was simulated with the differential power amplifier 203, six TX coils 103, and six different reflected loads. The simulation results with different $Z_{ref}$ are shown in FIG. 7. The simulated currents of the TX coils 103 are with an input voltage $V_{IN}$=10V. Six coils are activated in phase with $Z_{ref}$=0.9Ω, 3Ω, 7Ω, 10Ω, 15Ω, 20Ω, respectively. It can be observed that the amplitude of currents $I_{TX1}, I_{TX2}, \ldots, I_{TX6}$, were changing from 40 mA to 230 mA while the system was simulated with $Z_{ref1}, \ldots, Z_{ref6}$ varying from 0.9Ω to 20Ω. The percent variation of the current was +/−81%.

The amplitude variation of $I_{TX}$ is larger when comparing $Z_{ref}$=0.9Ω and 20Ω, which represents the weakest coupling and strongest coupling in the disclosed 3-D WPT system. In addition to the current amplitude change, there is slight time delay of the current waveform introduced even if only resistance variation is considered. Though, the conventional structure requires less components, the unstable current behavior makes this structure not suitable for coil array system.

Figure 8A:
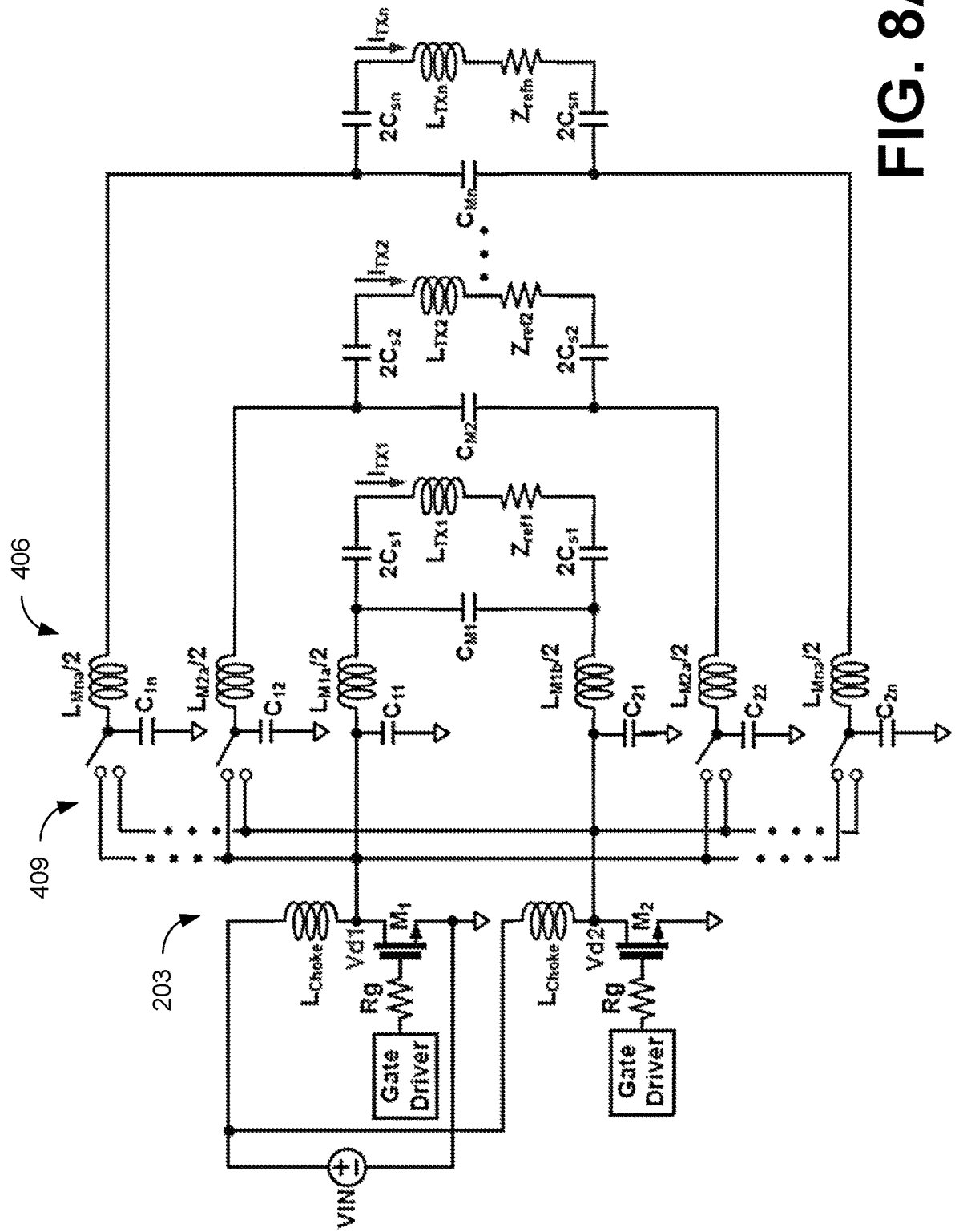
FIGS. 8A and 8B are a schematic diagrams illustrating examples of a control circuit including a switching structure coupled to a plurality of TX coils through multiple LCL-π networks, in accordance with various embodiments of the present disclosure.
Figure 8B:
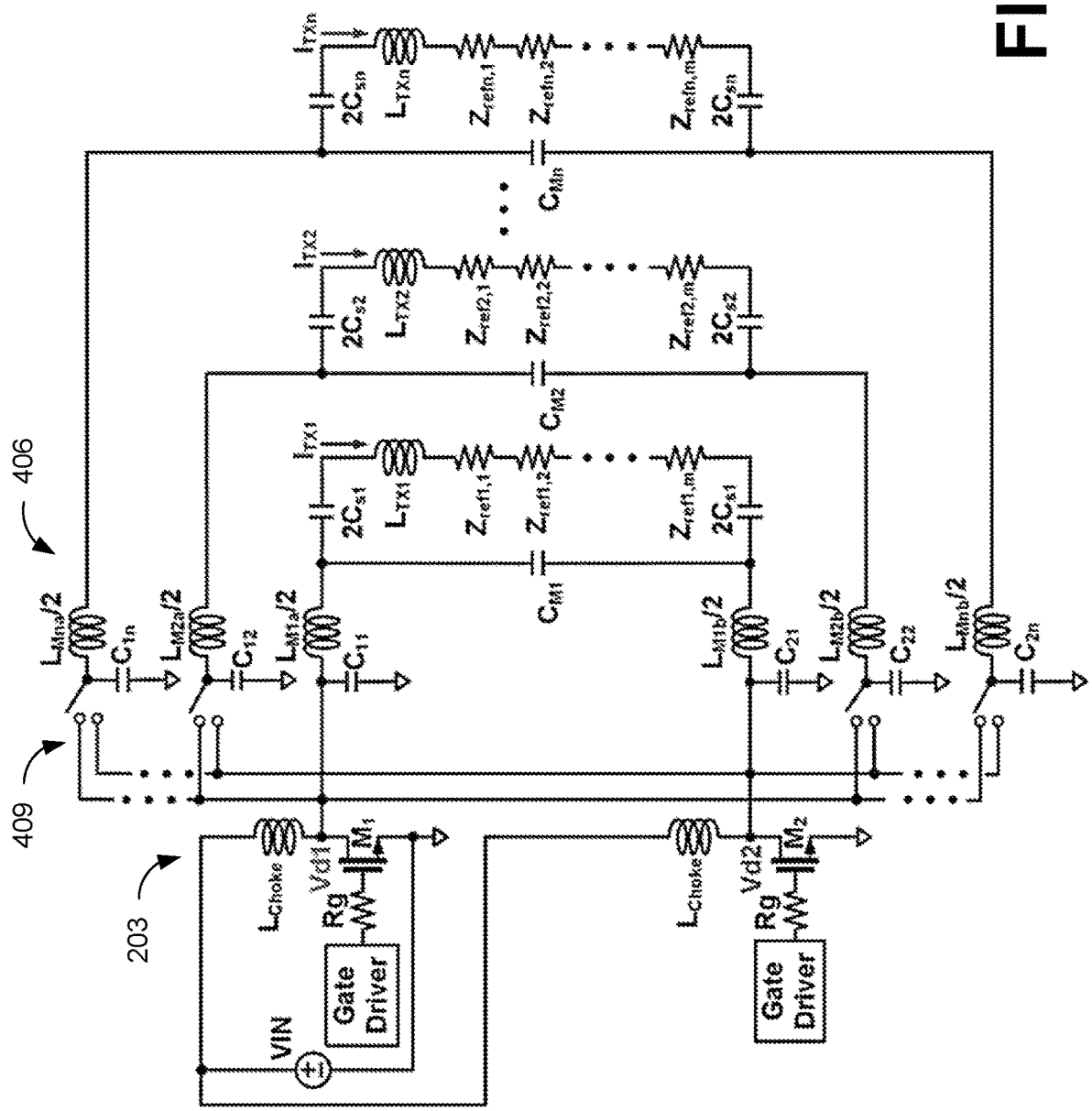
Figure 8:
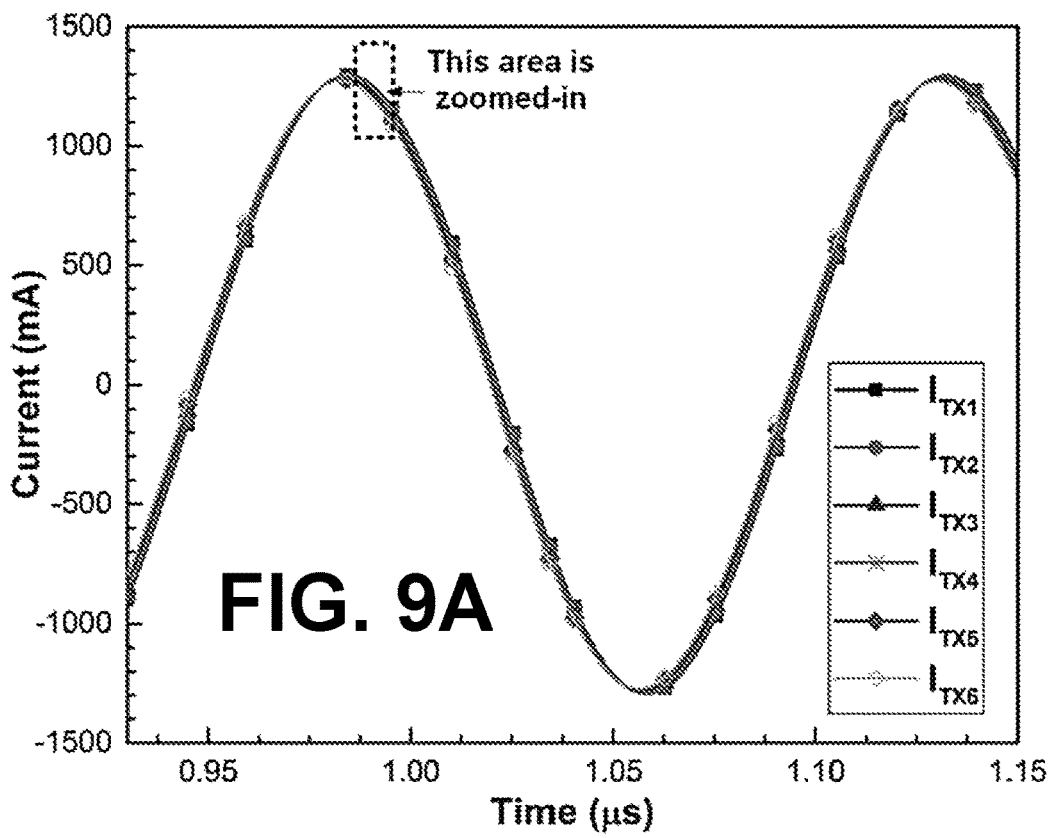
Figure 8:
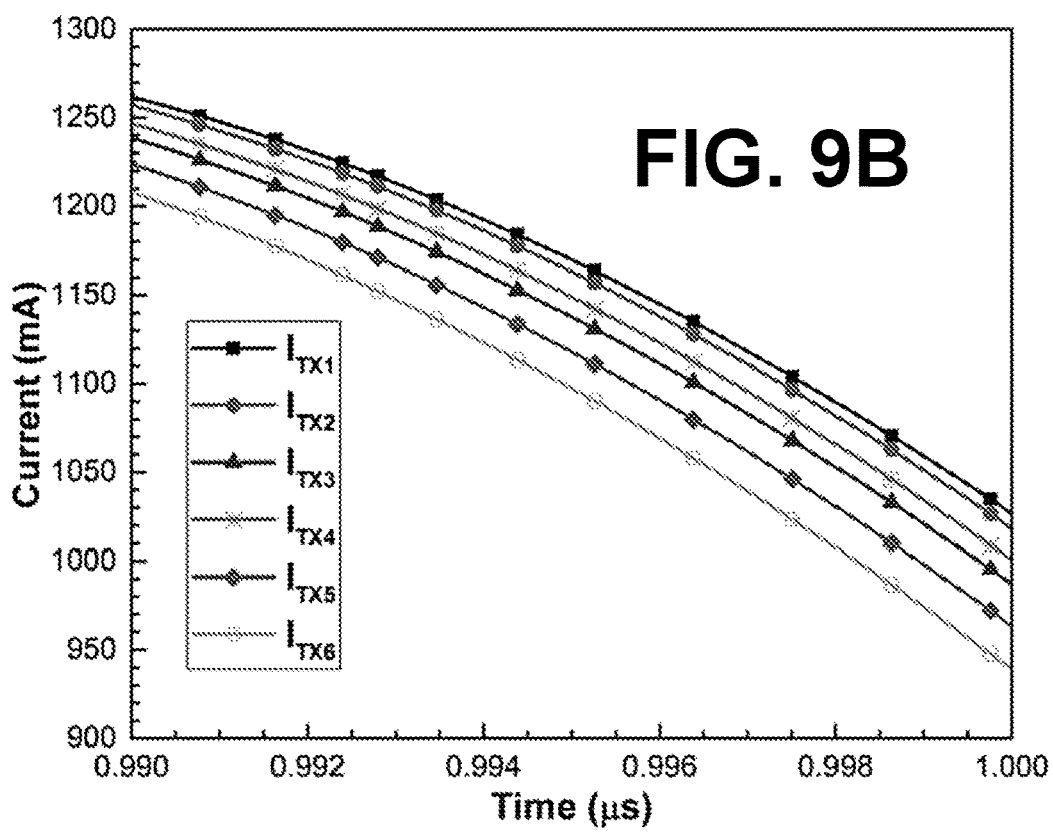

To further improve transmitter performance, multiple LCL-π matching networks can be connected in parallel with a class-E power amplifier, as shown in FIGS. 8A and 8B. In the example of FIG. 8A, the TX coils 103 are modeled by $L_{TXn}$, and the load of the RX device 109 is modeled by $Z_{refn}$. In FIG. 8B, the system supplies m RX devices 109 with their loads modeled by $Z_{refn,m}$. Referring to FIG. 8A, shown is an example of a control circuit with the differential amplifier 203 and a switching structure 409 with matching networks 406. In FIG. 8A, the input signal from the differential amplifier 203 can be controlled by, e.g., a 2-way switch 409 to provide the same amplitude but different phases to the independent matching networks 406. In other embodiments, the switching structure 409 can be an N-way switch, which depends on the phase combination of the input signal. For example, a differential class E power amplifier can be used to drive some or all of the TX coils 103 with 0° or 180° phase relationships, as illustrated in FIG. 8A. In the example of FIG. 8B, the differential class-E power amplifier is used to drive some or all of transmitting coils with 0° or 180° phase relationships. In order to keep each matching network independent, the 2-way switch is placed close to the TX coils.

The 2-way switch 409 of FIG. 8A can be controlled to activate the TX coils 103 individually. While driving the TX coils 103 with 0° or 180° phase relationships simplifies the control, other phase differences may be activated to improve and/or optimize the wireless power delivery to the RX device. In order to keep each matching network 406 independent, the switches should be located close to the TX coils 103. The transmitting currents, $I_{TX1}, \ldots, I_{TXn}$, are relatively independent from the load, $Z_{refn}$, because of the tuning network composed of $LM_n$, $CM_n$, $L_{TXn}$ and $C_{sn}$. In one embodiment, it can be assumed that the value of each path is:

$$X_{LM} = X_{CM} = \omega L_{TX} - \frac{1}{\omega C_s},$$

where $X_{LM}$ and $X_{CM}$ are the reactance of inductor $L_M$ and capacitor $C_M$, respectively, and ω is the operational frequency of the switching structure 409. In other embodiments, $$\omega L_{TX} - \frac{1}{\omega C_s}$$

may be greater than or less than $X_{LM}$ and/or $X_{CM}$.

The control circuit of FIGS. 8A and 8B was simulated with the differential power amplifier 203, six TX coils 103, and six different reflected loads. FIG. 9A shows an example of the current waveform for the simulated TX coil currents with $V_{IN}$=10 V from 0.93 μs to 1.15 μs, and FIG. 9B shows an expanded portion of the current waveform of FIG. 9A from 0.99 μs to 1.0 μs. Using the 6-coil transmitter to charge the RX device 106, the current flowing through each TX coil 103 was relatively constant within an operating time period, as shown in FIG. 9A. With the reflected resistance load $Z_{ref}$ increasing from 0.9Ω to 20Ω (i.e., 0.9Ω, 3Ω, 7Ω, 10Ω, 15Ω, 20Ω, respectively), the variation of the TX coil currents were less than ±5%, as illustrated in FIG. 9B. Comparing to the simulated results in FIG. 7 with those of FIG. 9A, the independent matching networks 406 of FIG. 8A are less sensitive to the load variation regardless of the input phase combination.

Figure 9C:
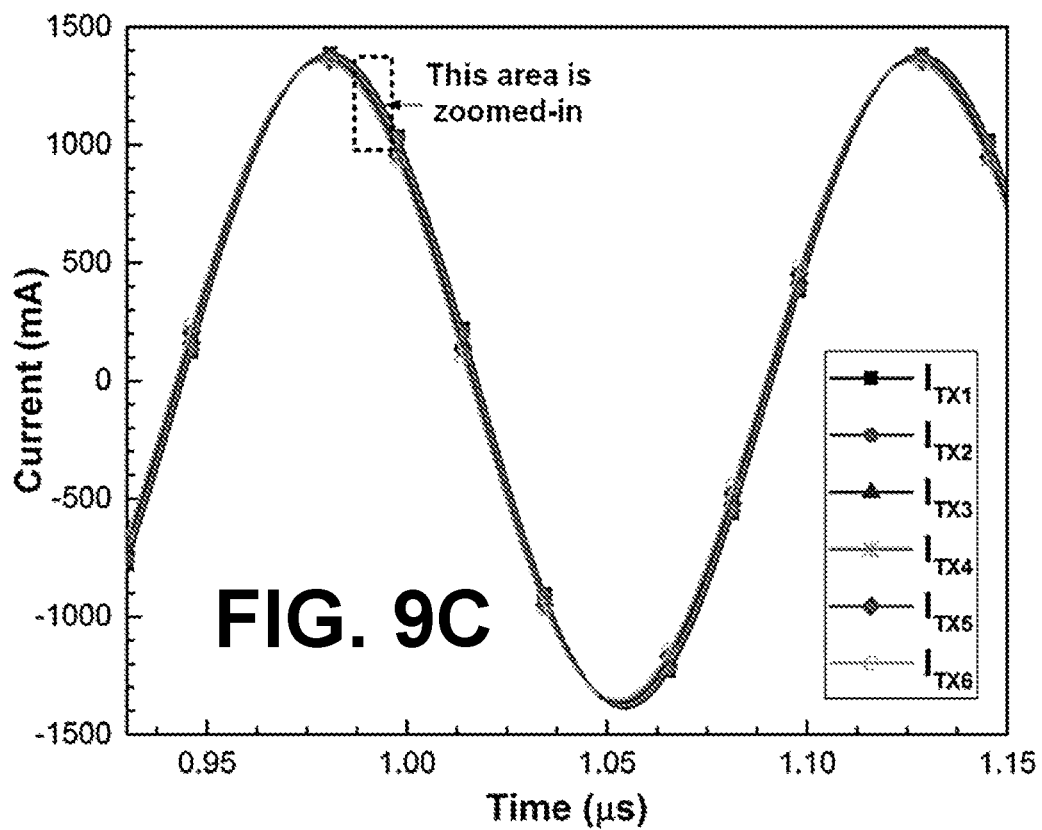
Figure 9D:
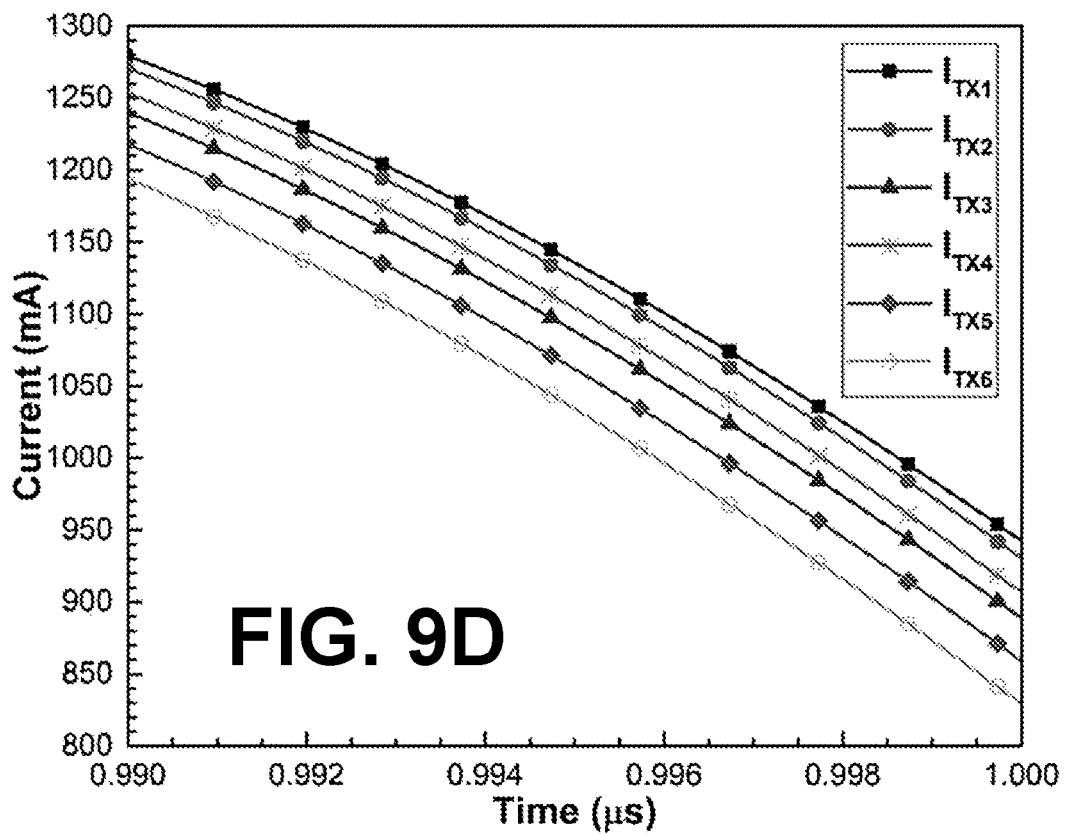
Figure 10:
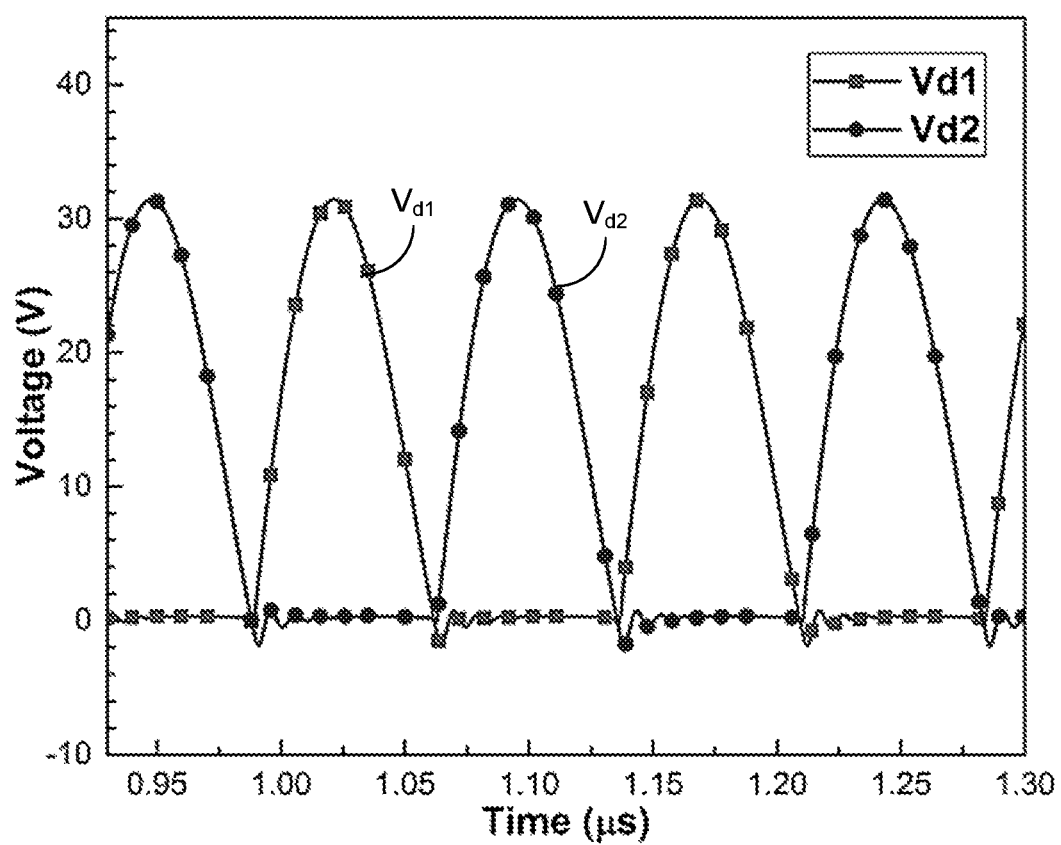

Moreover, there is nearly no time delay with resistive variation. Another simulation is performed with $V_{IN}$=10 V, and the reactance variation from $Z_{ref}$=47 mF to $Z_{ref}$=1 μH, as shown in FIGS. 9C and 9D. FIG. 9C shows the current waveform from 0.93 μs to 1.15 μs, and FIG. 9D shows the waveform zoomed-in from 0.99 μs to 1.0 μs. According to FIG. 9B, the current $I_{TX}$ variation is less than 8%. Thus, with a stable current behavior over a wide range of resistance and reactance change, the proposed circuit can be applied to an arbitrary coil array WPT system. FIG. 10 shows an example of the simulated drain voltages when the input voltage $V_{IN}$=10V. By properly adjusting capacitors $C_{11}, C_{12}, \ldots, C_{1n}, C_{21}, \ldots, C_{2n}$, the zero-voltage switching condition of drain voltage, $V_{d1}$ and $V_{d2}$, can be achieved, as shown in FIG. 10.

Experimental Setup and Measurement Results

Figure 11:
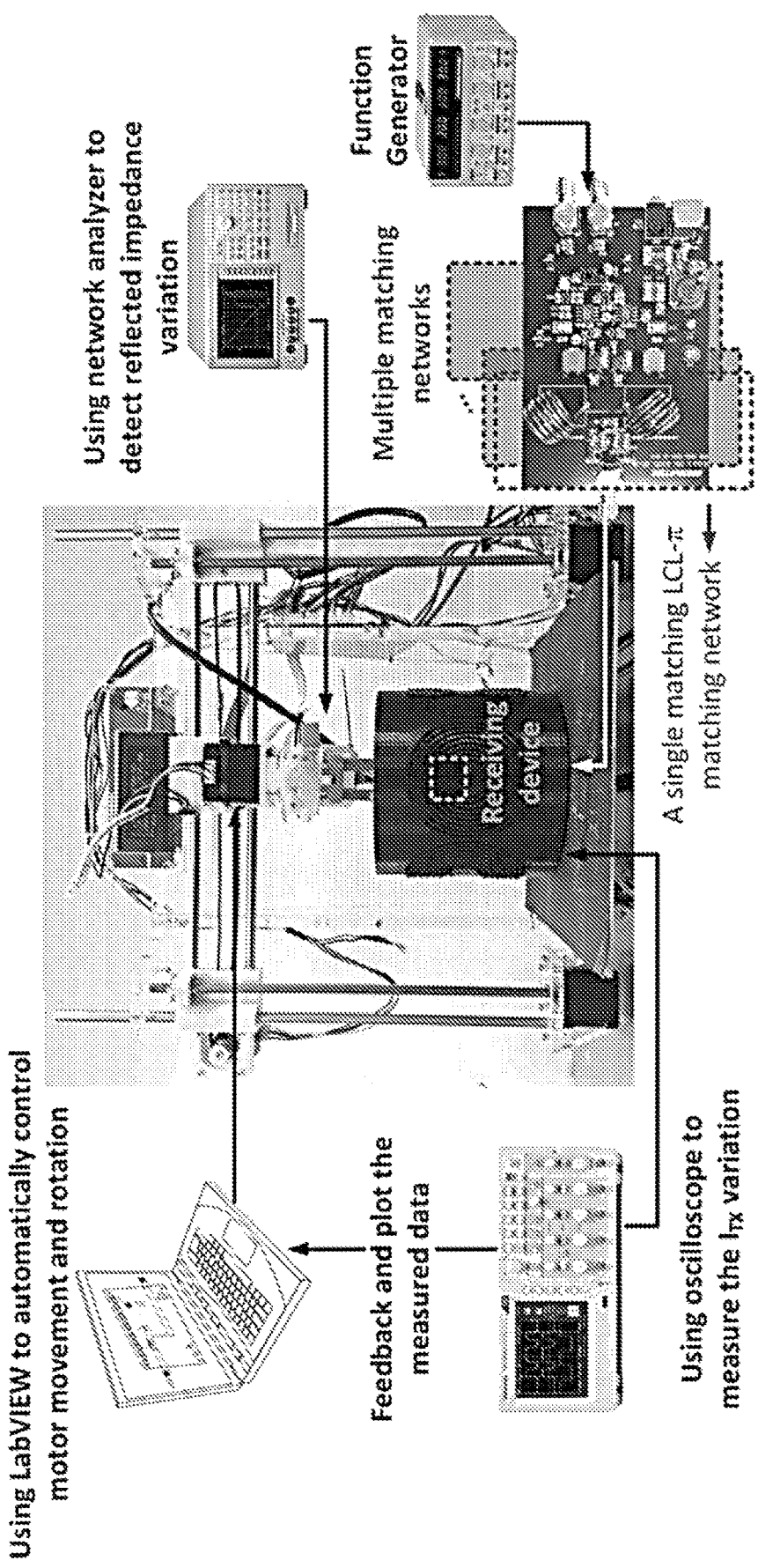
FIG. 11 is a graphical representation of a measurement setup with multiple LCL-π networks, in accordance with various embodiments of the present disclosure.

To demonstrate the proposed structure, a measurement setup shown in FIG. 11 was used to test the disclosed system. Multiple LCL-π matching networks were connected to transmitter printed circuit board (PCB) made of power amplifier, driver circuits and a bulk converter. The number of connected networks was decided by the number of activated TX coils, which was also related to the orientation and position of RX devices. To avoid unwanted electromagnetic (EM) interference with test equipment components, the experiment was done by an automatic scanner purposely made of nonmetallic materials. Reflected impedance values versus current $I_{TX}$ were collected by an oscilloscope and being fed back to a computer to plot the results. A network analyzer was used to detect reflected impedance variation. A maximum of six coils were activated with different $Z_{ref}$ in this experiment.

Figures 12, 13:
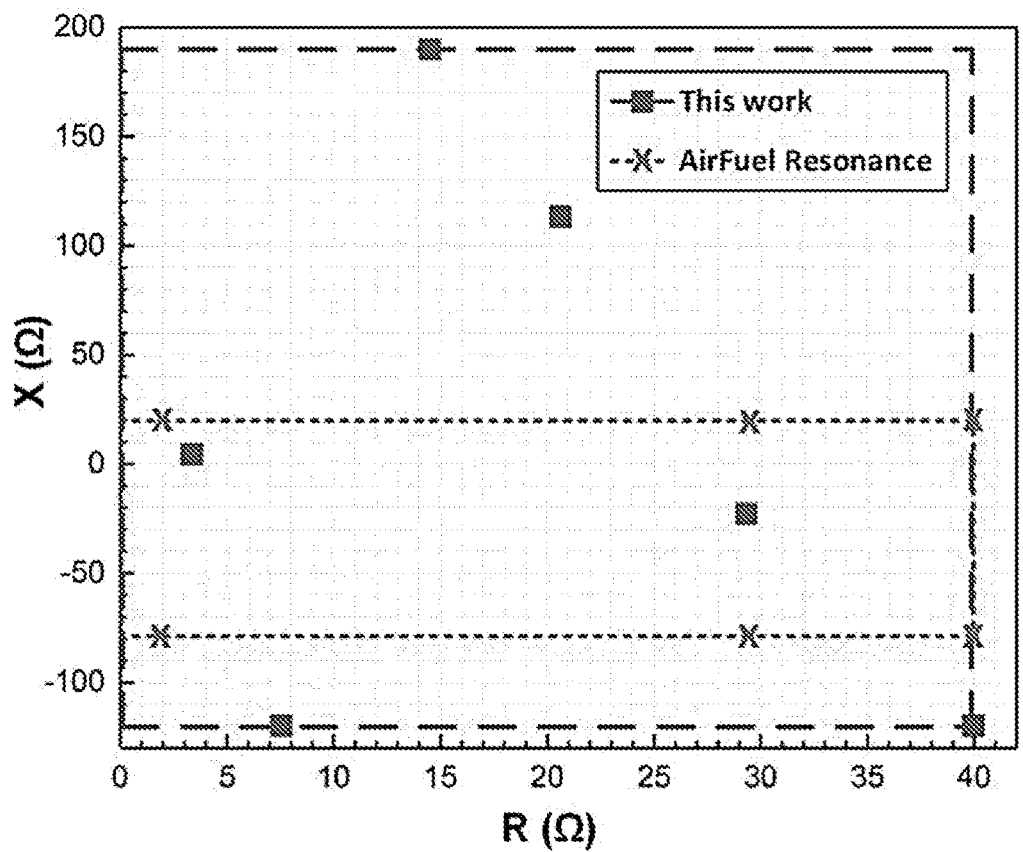
FIG. 12 illustrates measured reflected impedance using the measurement setup of FIG. 11, in accordance with various embodiments of the present disclosure.
FIG. 13 is a table comparing load-independent realizations for WPT systems, in accordance with various embodiments of the present disclosure.

FIG. 12 shows the summary of measurements results versus reflected impedance box. It can be seen that the transmitting current remains constant within a wide range of impedance variation. The measured reflected impedance is compared to the Airfuel defined reflected impedance box. The coil currents may be held within less than 8% in this $Z_{ref}$ variation box. It should be noted that implementation of multiple matching networks may occupy larger area. Though, in practical implementations the additional coils, switches as well as matching networks can be integrated within the housing of the transmitter and performance advantages will subjugate component number increase. The table of FIG. 13 compares the performance with prior works. The proposed system demonstrate the capability against widest resistive and reactive load variation.

A design method and a parallel structure of power amplifier for 3-D wireless power transfer system are proposed and discussed. Adopting multiple LCL-π matching networks, transmitter coil currents remain substantially invariant over a wide range of reactance and resistance change. Measurement results also show that the WPT transmitter maintains relatively stable regardless of the placement, orientation or the number of RX devices. The above features make the disclosed solution suitable for practical systems which can be further developed to satisfy specifications of some known WPT standards.

It should be emphasized that the above-described embodiments of the present disclosure are merely possible examples of implementations set forth for a clear understanding of the principles of the disclosure. Many variations and modifications may be made to the above-described embodiment(s) without departing substantially from the spirit and principles of the disclosure. All such modifications and variations are intended to be included herein within the scope of this disclosure and protected by the following claims.

It should be noted that ratios, concentrations, amounts, and other numerical data may be expressed herein in a range format. It is to be understood that such a range format is used for convenience and brevity, and thus, should be interpreted in a flexible manner to include not only the numerical values explicitly recited as the limits of the range, but also to include all the individual numerical values or sub-ranges encompassed within that range as if each numerical value and sub-range is explicitly recited. To illustrate, a concentration range of "about 0.1% to about 5%" should be interpreted to include not only the explicitly recited concentration of about 0.1% to about 5%, but also include individual concentrations (e.g., 1%, 2%, 3%, and 4%) and the sub-ranges (e.g., 0.5%, 1.1%, 2.2%, 3.3%, and 4.4%) within the indicated range. The term "about" can include traditional rounding according to significant figures of numerical values. In addition, the phrase "about 'x' to 'y'" includes "about 'x' to about 'y'".

Therefore, at least the following is claimed:

1. A wireless charging system, comprising:
a three-dimensional (3D) coil array; and
control circuitry configured to adjust a magnetic field generated by the 3D coil array, the control circuitry comprising a switching structure coupled to transmitting (TX) coils of the 3D coil array via independent matching networks, where the TX coils are configured for individual activation by a power amplifier through a corresponding N-way switch of the switching structure, wherein the N-way switch switches between a V+ terminal, a V− terminal and a ground terminal.

2. The wireless charging system of claim 1, wherein the TX coils comprise a plurality of coils distributed about a circumference of a charging structure.

3. The wireless charging system of claim 2, wherein the plurality of coils are evenly distributed about the circumference of the charging structure.

4. The wireless charging system of claim 1, wherein each of the independent matching networks comprise a matching inductance ($L_M$) in series with a corresponding TX coil of the 3D coil array, and a matching capacitance ($C_M$) in parallel with the corresponding TX coil.

5. The wireless charging system of claim 4, wherein the matching inductance ($L_M$) is provided by a pair of inductors.

6. The wireless charging system of claim 4, wherein each of the independent matching networks comprise a capacitance $C_s$ in series with the corresponding TX coil.

7. The wireless charging system of claim 6, wherein reactance of the matching inductance ($X_{LM}$) and reactance of the matching capacitance ($X_{CM}$) are related by:

$$X_{LM} = X_{CM} = \omega L_{TX} - \frac{1}{\omega C_s},$$

where ω is an operation frequency of the switching structure, $L_{TX}$ is a TX inductance of the corresponding TX coil.

8. The wireless charging system of claim 6, wherein the capacitance $C_s$ is provided by a pair of capacitors in series with the corresponding TX coil.

9. The wireless charging system of claim 4, wherein each of the independent matching networks comprise an adjustment capacitance coupled between a switch of the switching structure and the matching inductance ($L_M$).

10. The wireless charging system of claim 1, wherein power for charging a receiving device is provided by a differential amplifier coupled to the switching structure.

11. The wireless charging system of claim 1, wherein the independent matching networks are LCL-π matching networks.

* * * * *